United States Patent
Finn et al.

(10) Patent No.: US 8,366,009 B2
(45) Date of Patent: Feb. 5, 2013

(54) COUPLING IN AND TO RFID SMART CARDS

(75) Inventors: David Finn, Tourmakeady (IE); Klaus Ummenhofer, Kaufbeuren (DE)

(73) Assignee: Féinics AmaTech Teoranta, Lower Churchfield, Tourmakeady, Co. Mayo (IE)

( * ) Notice: Subject to any disclaimer, the term of this patent is extended or adjusted under 35 U.S.C. 154(b) by 0 days.

(21) Appl. No.: 13/310,718

(22) Filed: Dec. 3, 2011

(65) Prior Publication Data

US 2012/0074233 A1    Mar. 29, 2012

Related U.S. Application Data

(63) Continuation-in-part of application No. 13/205,600, filed on Aug. 8, 2011, and a continuation-in-part of application No. 13/294,578, filed on Nov. 11, 2011.

(60) Provisional application No. 61/373,269, filed on Aug. 12, 2010.

(Continued)

(51) Int. Cl.
*G06K 19/06* (2006.01)

(52) U.S. Cl. ........................................ 235/492

(58) Field of Classification Search ................ 235/492
See application file for complete search history.

(56) References Cited

U.S. PATENT DOCUMENTS

| | | | |
|---|---|---|---|
| 5,012,236 A | 4/1991 | Troyk et al. | |
| 5,084,699 A | 1/1992 | DeMichele | |
| 5,428,214 A | 6/1995 | Hakkers et al. | |
| 5,773,812 A | 6/1998 | Kreft | |
| 5,955,723 A | 9/1999 | Reiner | |
| 6,008,993 A | 12/1999 | Kreft | |
| 6,095,423 A | 8/2000 | Houdeau et al. | |
| 6,142,381 A | 11/2000 | Finn et al. | |
| 6,173,899 B1 | 1/2001 | Rozin | |
| 6,190,942 B1 | 2/2001 | Wilm et al. | |
| 6,233,818 B1 | 5/2001 | Finn et al. | |
| 6,295,720 B1 | 10/2001 | Finn et al. | |
| 6,310,778 B1 | 10/2001 | Finn et al. | |
| 6,373,447 B1 | 4/2002 | Rostoker et al. | |
| 6,375,083 B2 | 4/2002 | Fries et al. | |
| 6,378,774 B1 | 4/2002 | Emori et al. | |

(Continued)

FOREIGN PATENT DOCUMENTS

| | | |
|---|---|---|
| CA | 2279176 | 7/1998 |
| DE | 3935364 | 8/1990 |

(Continued)

OTHER PUBLICATIONS

Antenna_(Radio) http://en.wikipedia.org/wiki/Antenna_(radio) Jul. 31, 2011 23 pages.

(Continued)

*Primary Examiner* — Kristy A Haupt
(74) *Attorney, Agent, or Firm* — Gerald E. Linden

(57) ABSTRACT

A dual interface (DI) smart card (100) comprising a chip module (CM), a module antenna (MA), a card body (CB) and a card antenna (CA) having two windings (D,E) connected with reverse phase as a "quasi-dipole". Capacitive stubs (B,C) connected with an antenna structure (A) of the module antenna (MA). The module antenna (MA) overlaps only one of the windings (D or E) of the card antenna (CA). The card antenna (CA) may be formed from one continuous wire. Ferrite (156) shielding the module antenna (MA) from contact pads (CP) and for enhancing coupling between the module antenna (MA) and the card antenna (CA).

26 Claims, 17 Drawing Sheets

Related U.S. Application Data provisional application No. 61/373,269, filed on Aug. 12, 2010, provisional application No. 61/384,219, filed on Sep. 17, 2010, provisional application No. 61/251,741, filed on Aug. 9, 2011, provisional application No. 61/533,228, filed on Sep. 11, 2011, provisional application No. 61/356,153, filed on Sep. 19, 2011, provisional application No. 61/561,938, filed on Nov. 21, 2011, provisional application No. 61/493,448, filed on Jun. 4, 2011, provisional application No. 61/493,611, filed on Jun. 6, 2011.

(56) References Cited

U.S. PATENT DOCUMENTS

| | | |
|---|---|---|
| 6,406,935 B2 | 6/2002 | Kayanakis |
| 6,698,089 B2 | 3/2004 | Finn et al. |
| 6,719,206 B1 | 4/2004 | Bashan et al. |
| 6,786,419 B2 | 9/2004 | Kayanakis |
| 6,908,786 B2 | 6/2005 | Halope |
| 7,028,910 B2 | 4/2006 | Reignoux et al. |
| 7,320,738 B2 | 1/2008 | Radenne et al. |
| 7,742,009 B2 | 6/2010 | Li et al. |
| 7,928,918 B2 | 4/2011 | Caruana et al. |
| 7,980,477 B2 | 7/2011 | Finn |
| 2002/0020903 A1 | 2/2002 | Kreft et al. |
| 2003/0116790 A1 | 6/2003 | Kikuchi et al. |
| 2008/0211728 A1 | 9/2008 | Eray |
| 2008/0283615 A1 | 11/2008 | Finn |
| 2008/0308641 A1 | 12/2008 | Finn |
| 2008/0314990 A1 | 12/2008 | Rietzler |
| 2009/0057414 A1 | 3/2009 | Brunet et al. |
| 2009/0152362 A1 | 6/2009 | Ayala et al. |
| 2009/0315320 A1 | 12/2009 | Finn |
| 2010/0176205 A1* | 7/2010 | Patrice ............ 235/492 |
| 2010/0283690 A1 | 11/2010 | Artigue et al. |
| 2011/0011939 A1 | 1/2011 | Seah |
| 2011/0148583 A1 | 6/2011 | Roosenboom et al. |
| 2011/0163167 A1 | 7/2011 | Artigue et al. |

FOREIGN PATENT DOCUMENTS

| | | |
|---|---|---|
| DE | 19616424 | 10/1997 |
| DE | 4311493 | 6/2000 |
| EP | 0 977 145 | 2/2000 |
| EP | 2 120 190 | 11/2009 |

OTHER PUBLICATIONS

Product short data sheet, P5CD016/021/041/051 and P5Cx081 family, Secure dual interface and contact PKI smart card controller, Rev 3.2—Mar. 2011, 20pages.

Preliminary Short Product Information, SLE 66CLX360PE(M) Family, 8/16-Bit Security Dual Interface Controller for Contact Based and Contactless Applications, Infineon, Nov. 2006, 14 pages.

SmartMX for programmable high-security, multi-application smart cards, NXP, 2009, 2 pages.

mifare DESFire Data Sheet Addendum, Preliminary specification, Revision 2.0, Apr. 2003, 7 pages M086820_MF3ICD4O_ModuleSpec.

SLE 66 CX126PE, short Product Overview, May 2010, 4 pages.

International Search Report and Written Opinion of the International Searching Authority, Jun. 19, 2012.

* cited by examiner

DIF Smart Card
(and readers)

DIF Smart Card module antenna (MA) subassembly

DIF Smart Card

DI Chip Module module antenna (MA)
with antenna (A) and capacitive stubs (B,C)

antenna module (AM)

Card Antenna (CA)

coupling the AM with the CA single winding CA interleaved windings spacing to make overlap easier spacing to make overlap easier opposite "sense" (and 7/10 connection)

opposite ends (and 8/9 connection)

"stacked" windings shielding one of the two windings two Antenna Modules (AM1, Am2)
both coupled with E 2-edge coupling of AM3 to D "L" shaped jog in CA
2 edge coupling of AM to E "U" shaped jog in CA
3 edge coupling of AM1 with D inverse "U-shaped" jog,
3 edge coupling with E three Antenna Modules (AM1, AM2, AM3)
AM1 - 3 edge coupling with E
AM2 - 2 edge coupling with D
AM1 - 1 edge coupling with E pitches of inner winding E and outer winding D round module antenna MA
spacing for free ends 8,9 foil on tape define contact pads (CP)

DIF Module with Ferrite Layer

DIF Module

DI Smart Card turn(s) extending into recess

COUPLING IN AND TO RFID SMART CARDS

TECHNICAL FIELD

The invention relates to "secure documents" such as electronic passports, electronic ID cards and smart cards having RFID (radio frequency identification) chips or chip modules and operating in a contactless mode (ISO 14443) including dual interface ("DI", or "DIF") cards which can also operate in contact mode (ISO 7816-2), and more particularly to improving coupling between components within the smart card, such as between a module antenna (MA) associated with the chip module (CM) and a card antenna (CA) on the card body (CB) of the smart card and consequent improvements in interacting with external RFID readers.

BACKGROUND

For purposes of this discussion, an RFID transponder generally comprises a substrate, an RFID chip (or chip module) disposed on or in the substrate, and an antenna disposed on or in the substrate. The transponder may form the basis of a secure document such as an electronic passport, smart card or national ID card.

The chip module may operate solely in a contactless mode (such as ISO 14443), or may be a dual interface (DIF) module which can operate also in contact mode (such as ISO 7816-2) and a contactless mode. The chip module may harvest energy from an RF signal supplied by an external RFID reader device with which it communicates.

The substrate, which may be referred to as an "inlay substrate" (for electronic passport) or "card body" (for smart card) may comprise one or more layers of material such as Polyvinyl Chloride (PVC), Polycarbonate (PC), polyethylene (PE), PET (doped PE), PET-G (derivative of PE), Teslin™, Paper or Cotton/Noil, and the like. When "inlay substrate" is referred to herein, it should be taken to include "card body", and vice versa, unless explicitly otherwise stated.

The chip module may be a leadframe-type chip module or an epoxy-glass type chip module. The epoxy-glass module can be metallized on one side (contact side) or on both sides with through-hole plating to facilitate the interconnection with the antenna. When "chip module" is referred to herein, it should be taken to include "chip", and vice versa, unless explicitly otherwise stated.

The antenna may be a self-bonding (or self-adhering) wire. A conventional method of mounting an antenna wire to a substrate is to use a sonotrode (ultrasonic) tool which vibrates, feeds the wire out of a capillary, and embeds it into or sticks it onto the surface of the substrate. A typical pattern for an antenna is generally rectangular, in the form of a flat (planar) coil (spiral) having a number of turns. The two ends of the antenna wire may be connected, such as by thermo-compression (TC) bonding, to terminals (or terminal areas, or contact pads) of the chip module. See, for example U.S. Pat. No. 6,698,089 and U.S. Pat. No. 6,233,818, incorporated by reference herein.

A problem with any arrangement which incorporates the antenna into the chip module (antenna module) is that the overall antenna area is quite small (such as approximately 15 mm×15 mm), in contrast with a more conventional antenna which may be formed by embedding several (such as 4 or 5) turns of wire around a periphery of the of the inlay substrate or card body of the secure document, in which case the overall antenna area may be approximately 80 mm×50 mm (approximately 20 times larger). When an antenna is incorporated with the chip module, the resulting entity may be referred to as an "antenna module".

SOME STATE OF THE ART

The following patents and publications are incorporated in their entirety by reference herein.

U.S. Pat. No. 5,084,699 (Trovan, 1992) entitled Impedance Matching Coil Assembly For An Inductively Coupled Transponder. Attention is directed to FIG. 5. A coil assembly for use in an inductively powered transponder includes a primary coil (156) and a secondary coil (158) wrapped around the same coil forming ferrite rod (160). The primary coil's leads (162) are left floating while the secondary coil's leads (164) are connected to the integrated identification circuit of the transponder.

U.S. Pat. No. 5,955,723 (Siemens, 1999) entitled Contactless Chip Card discloses a data carrier configuration includes a semiconductor chip. Attention is directed to FIG. 1. A first conductor loop (2) is connected to the semiconductor chip (1) and has at least one winding and a cross-sectional area with approximately the dimensions of the semiconductor chip. At least one second conductor loop (3) has at least one winding, a cross-sectional area with approximately the dimensions of the data carrier configuration and a region forming a third loop (4) with approximately the dimensions of the first conductor loop (2). The third loop (4) inductively couples the first conductor loop (2) and the at least one second conductor loop (3) to one another.

U.S. Pat. No. 6,378,774 (Toppan, 2002) entitled IC Module and Smart Card. Attention is directed to FIGS. 12A,B and 17A,B. A smart card comprises an IC module and an antenna for non-contact transmission. The IC module has both a contact-type function and a non-contact-type function. The IC module and the antenna comprise first and second coupler coils, respectively, which are disposed to be closely coupled to each other, and the IC module and the antenna are coupled in a non-contact state by transformer coupling.

Toppan's antenna (4) comprises two similar windings (4a, 4b), which are shown in FIG. 17A disposed on opposite sides of a substrate (5), one substantially atop the other. A coupler coil (3) is associated with the card antenna (4). Another coupler coil (8) is associated with the chip module (6). As best viewed in FIGS. 12A and 12B, the two coupler coils (3, 8) are of approximately the same size and are disposed substantially one atop the other.

U.S. Pat. No. 7,928,918 (Gemalto, 2011) entitled Adjusting Resonance Frequency By Adjusting Distributed Inter-Turn Capacity discloses a method for adjusting frequency tuning of a resonant circuit with turns having a regular spacing generating stray inter-turn capacity.

US 2009/0152362 (Assa Abloy, 2009) discloses Coupling Device For Transponder And Smart Card With Such Device. Attention is directed to FIG. 6. A coupling device is formed by a continuous conductive path having a central section (12) and two extremity sections (11, 11'), the central section (12) forming at least a small spiral for inductive coupling with the transponder device, the extremities sections (11, 11') forming each one large spiral for inductive coupling with the reader device.

Assa Abloy shows that the inner end of the outer extremity section (11) and the outer end of the inner extremity section (11') are connected with the coupler coil (12). The outer end (13) of the outer extremity section (11) and the inner end (13') of the inner extremity section (11') are left unconnected (loose).

US2010/0176205 (SPS, 2010) entitled Chip Card With Dual Communication Interface. Attention is directed to FIG. 4. A card body (22) includes a device (18) for concentrating and/or amplifying electromagnetic waves, which can channel the electromagnetic flow received, in particular, from a contactless chip card reader toward the coils of the antenna (13) of the microelectronic module (11). The device (18) for concentrating and/or amplifying electromagnetic waves may consist of a metal sheet disposed in the card body (22) below the cavity (23) receiving the microelectronic module (11), or may consist of an antenna consisting of at least one coil, disposed in the card body (22) below the cavity (23) receiving the microelectronic module (11).

Refer also to the following: CA 2,279,176; DE 4311493; U.S. Pat. No. 6,142,381; U.S. Pat. No. 6,310,778; U.S. Pat. No. 6,406,935; U.S. Pat. No. 6,719,206; US 2009/0057414; US 2010/0283690; and US 2011/0163167.

SUMMARY

A dual interface (DI) smart card (100) comprising a chip module (CM), a module antenna (MA), a card body (CB) and a card antenna (CA) having two windings (D,E) connected with reverse phase as a "quasi-dipole". Capacitive stubs (B,C) connected with an antenna structure (A) of the module antenna (MA). The module antenna (MA) overlaps only one of the windings (D or E) of the card antenna (CA). The card antenna (CA) may be formed from one continuous wire. Ferrite (156) shielding the module antenna (MA) from contact pads (CP) and for enhancing coupling between the module antenna (MA) and the card antenna (CA).

A dual interface (DIF) smart card comprises
  a generally rectangular card body CB which may be of multi-layer construction, measuring approximately 50 mm×80 mm,
  a DIF chip module CM measuring approximately 8 mm×10 mm, having metallic contact pads (CP) one side of the chip module CM and a module antenna MA on the other side of the chip module CM, and
  a card antenna CA extending around the periphery of the card body CB and having approximately the same overall size as the card body CB.

The module antenna MA has a number of turns in a flat spiral pattern, may be rounded, oval or generally rectangular having four side edges, and may be substantially the same overall size as the chip module CM. The module antenna may comprise a wire element wound as a flat coil, or may be etched in a flat coil pattern from a conductive layer on an insulating layer (such as epoxy glass film, or tape).

The card antenna CA may comprise two windings (or coils)—an outer winding D, and an inner winding E disposed interior of the outer winding D. The inner E and outer D windings are of substantially the same length as each other, each have two ends (or positions) 7, 8, 9, 10 and are connected to have "reverse phase" as a "quasi dipole". For example, the outer end (7) of the outer winding D is connected (or continuous) with the inner end 10 of the inner winding E.

The card antenna CA may be formed by conventional wire embedding, or using techniques other than wire embedding such as additive or subtractive processes to form conductive tracks and patterns.

The antenna module AM is disposed so that its module antenna MA overlaps one of the inner E or outer D windings, and not the other. No separate coupling coil is required to couple the module antenna MA with the card antenna (CA). Various configurations for the card antenna CA are disclosed, such as the antenna module AM is disposed interior the card antenna CA, and the module antenna MA overlaps only the inner winding E.
  the antenna module AM may be disposed exterior the card antenna CA with its module antenna MA overlapping only the inner winding E, or interior the card antenna CA with its module antenna MA overlapping on the outer winding D.
  additional one or more antenna modules AM1, AM2 may be provided and coupled with the card antenna CA to provide additional functionality
  the card antenna CA may alternatively be formed as a single winding which may require many more turns than the "quasi dipole" (two windings D, E connected with "reverse phase")

To alleviate adverse effects of the metallic contact pads CP on coupling between the module antenna MA and the card antenna CA, a shielding element such as ferrite may be incorporated in the antenna module AM between the module antenna MA and the contact pads CP of the chip module CM.

The module antenna MA may comprise a "main" antenna structure A and two additional antenna structures B, C which are capacitive stubs extending from ends of the antenna structure A.

The antenna module AM may be incorporated in a secure document such as an electronic passport cover, smart card, ID card, or the like.

According to some embodiments of the invention, a smart card (100) comprises:
  an antenna module (AM) comprising at least one chip or chip module (CM) and a module antenna (MA);
  a card body (CB) having at least one surface and a periphery; and
  a card antenna (CA) extending around the periphery of the card body (CB);
  characterized in that at least a portion of the module antenna (MA) overlaps at least a portion of the card antenna (CA) for coupling thereto without the intermediary of a coupling coil associated with the card antenna (CA).

According to some embodiments of the invention, a method of coupling a chip module (CM) having at least a contactless mode to a card antenna (CA) disposed on a card body (CB) of a smart card, comprising providing a module antenna (MA) in an antenna module (AM) with the chip module (CM), characterized by: providing the card antenna (CA) as "quasi dipole" antenna having two winding portions connected in reverse phase with one another. The card antenna (CA) may have an inner winding (E) and an outer winding (D); and the module antenna (MA) overlaps only one of the inner and outer windings (E, D).

A pre-laminated array of a special antenna configuration used in the production of contact & contactless transaction cards. In application, the card antenna sandwiched between the outer layers and the printed layers of a smart card, electromagnetically couples with an implanted antenna module AM in the card body CB, achieving a read/write range superior to existing DIF technology. This method of transceiving data is also a major advancement over the unreliable interconnection between a chip card module and an embedded antenna in a card body.

Secure printers can use their existing smart card milling and chip module implanting systems to produce EMV (Europay, MasterCard and VISA) compatible dual interface cards. Some features may include different sheet layouts to match printing press format, read/write distance optimized to each RFID chip, excellent mechanical and electrical characteristics, and easy integration into existing smart card production process.

BRIEF DESCRIPTION OF THE DRAWINGS

Reference will be made in detail to embodiments of the disclosure, non-limiting examples of which may be illustrated in the accompanying drawing figures (FIGs). The figures are generally diagrams. Some elements in the figures may be exaggerated, others may be omitted, for illustrative clarity. Although the invention is generally described in the context of various exemplary embodiments, it should be understood that it is not intended to limit the invention to these particular embodiments, and individual features of various embodiments may be combined with one another.

DETAILED DESCRIPTION

Various embodiments will be described to illustrate teachings of the invention(s), and should be construed as illustrative rather than limiting. In the main hereinafter, transponders in the form of secure documents which may be smart cards or national ID cards may be discussed as exemplary of various features and embodiments of the invention(s) disclosed herein. As will be evident, many features and embodiments may be applicable to (readily incorporated in) other forms of secure documents, such as electronic passports.

In the main hereinafter, antenna structures formed by embedding wire in an inlay substrate or card body are discussed as exemplary. However, it should be understood that the antenna may be formed using a processes other than by embedding wire in a substrate, such as additive or subtractive processes such as printed antenna structures, coil winding techniques (such as disclosed in U.S. Pat. No. 6,295,720), antenna structures formed on a separate antenna substrate and transferred to the inlay substrate (or layer thereof), antenna structures etched (including laser etching) from a conductive layer on the substrate, conductive material deposited in channels of a substrate layer, or the like.

The descriptions that follow are mostly in the context of dual interface (DI, DIF) smart cards, and relate mostly to the contactless operation thereof. Many of the teachings set forth herein may be applicable to electronic passports and the like having only a contactless mode of operation. Generally, any dimensions set forth herein are approximate, and materials set forth herein are intended to be exemplary.

By coupling, rather than connecting the chip module CM with the card antenna CA, the "weak link" of a physical connection between a chip module CM and a card body antenna (such as in U.S. Pat. No. 7,980,477) is eliminated. However, coupling is much more challenging to accomplish than a direct physical connection. Therefore, effective coupling between the module antenna MA and the card antenna CA and consequently to the antenna of a contactless reader is important.

The card antenna CA (and other features) disclosed herein may increase the effective operative distance between the antenna module AM and an external contactless reader with capacitive and inductive coupling. It transfers the energy to the antenna module AM by concentrating the magnetic field generated by a reader antenna at the position where the antenna module AM is located.

Figure 1A:
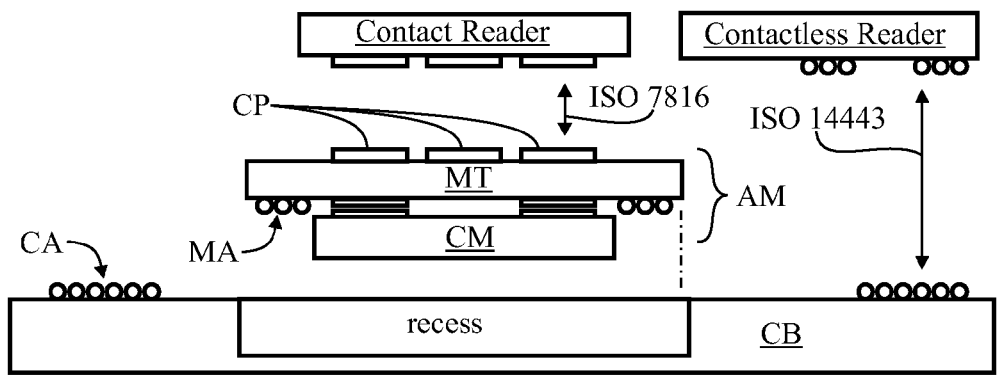
FIGS. 1A, 1B are cross-sectional views of DIF smart cards, according to the invention.
Figure 1B:
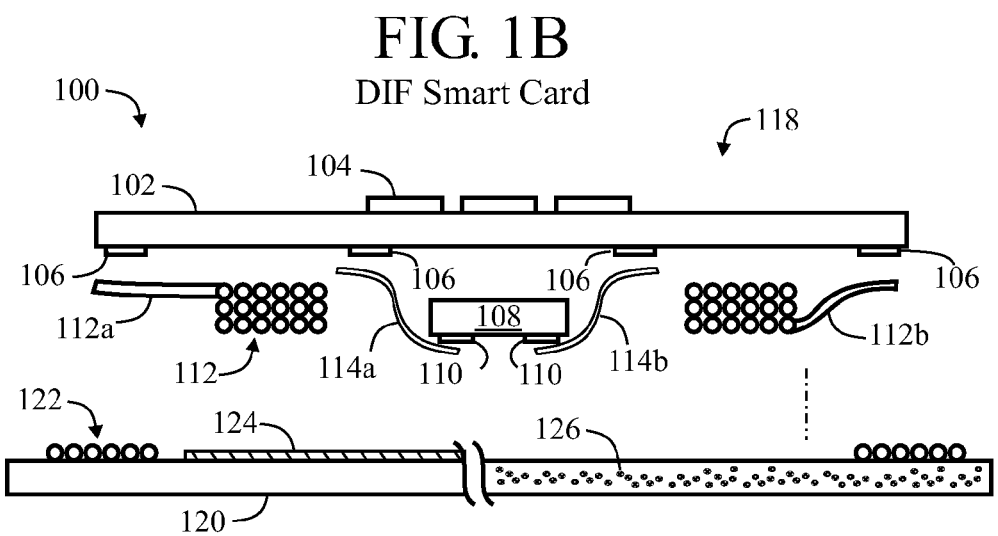

FIG. 1A illustrates a DIF smart card comprising:
- a DIF chip module CM disposed on an underside of a substrate or module tape MT;
- a number (such as six) of contact pads CP for implementing a contact interface (ISO 7816) on a top side of the module tape MT; and
- a module antenna (MA) disposed on the underside of the module tape (MT), typically formed from an etched conductor or wire, in a spiral (coil) pattern.
- The substrate MT supports and effects interconnections between the chip module CM, contact pads CP and module antenna MA, and may be single-sided, having metallization on only one side, or double-sided, having metallization on both sides.
- The chip module CM may be connected in any suitable manner, such as flip-chip connected (as illustrated in FIG. 1A) or wire bonded (as illustrated in FIG. 1B to the module tape MT.
- As used herein, "chip module" includes one or more bare semiconductor dice (chips). A "hybrid" chip module may comprise a chip for contact interface and a chip for contactless interface, or the like. Reference is made to U.S. Pat. No. 6,378,774 (Toppan, 2002) for an example of a DIF chip solution, and to US 2010/0176205 (SPS, 2010) for an example of a two chip solution wherein one chip performs the contact function and the other chip performs the contactless function.

Together, the chip module, CM, chip tape MT, contact pads CP and module antenna MA constitute an "antenna module" AM.

The smart card further comprises:

a substrate which for smart cards may be referred to as a "card body" CB. (For an electronic passport, the substrate would be an "inlay substrate".)

a card body antenna (CBA), or simply card antenna (CA) disposed around the periphery of the card body, typically in the form of a rectangular, planar spiral having a number of turns.

As used herein, card body CB is intended to embrace any substrate supporting card antenna CA and receiving the antenna module AM. A recess may be provided in the card body for receiving the antenna module AM.

Some exemplary and/or approximate dimensions, materials and specifications may be:

Module Tape (MT): epoxy-based tape, 60 μm thick

Chip Module (CM): NXP SmartMx or Infineon SLE66, or other

Antenna Module (AM): 15 mm×15 mm and 300 μm thick

Module Antenna (MA): several windings of 50 μm copper wire, approximately the size of the chip module CM (and not greater in size then the AM)

Card body CB: 50 mm×80 mm, 300 μm thick, polycarbonate (PC). The card body and its card antenna are significantly (such as 20 times) larger than the chip module CM and its module antenna MA.

Card Antenna CA: 3-12 turns of 112 μm copper, self-bonding wire, ultrasonically embedded in the card body CB, Additional layers (not shown), such as cover layers, may be laminated to the card body to complete the construction of the smart card.

FIG. 1A illustrates a contact reader having contacts for interacting (providing power and exchanging data) with the chip module CM via the contact pads CP in a contact mode (ISO 7316), and a contactless reader having an antenna for interacting with the chip module CM via the card antenna CA and the module antenna MA.

FIG. 1B illustrates (exploded view) an overall construction of a DIF smart card 100 comprising an epoxy glass substrate (MT) 102 having a number of contact pads (CP) 104 on its top (as viewed) surface for making a contact interface with an external reader in a "contact mode" of operation;

a number of bond pads 106 disposed on an opposite surface of the tape 102;

a DIF chip module (CM) 108 having a number (only two shown) of bond pads 110 on a front (bottom, as viewed) surface thereof;

a module antenna (MA) 112 comprising (for example) several turns of wire, such as in a 3×8 configuration (3 layers, each layer having 8 turns), and having two ends 112a and 112b.

The chip module 108 may be mounted to the underside (as viewed) of the tape 102 with its contact pads 110 connected such as by conventional wire bonding to selected ones of the bond pads 106 on the underside (as viewed) of the tape 102. Only two of the wire bond connections 114a and 114b are shown, for illustrative clarity.

The module antenna 112 is connected by its ends 112a, 112b such as be thermo compression bonding to two of the bond pads 106 on the underside of the tape 102, as indicated.

The aggregate of the elements described above, generally the module tape 102, chip module 108 and module antenna 112 may be referred to as an "antenna module" 118.

A card body (CB) 120 for the smart card has a larger card antenna (CA) 122 embedded just inward of its periphery. The module antenna 112 couples (electro-magnetically) with the card antenna 122 to improve coupling of the smart card with an external contactless reader. The card antenna 122 may be formed on the card body 120 using conventional ultrasonic wire embedding techniques.

To enhance coupling between the module antenna 112 and the card antenna 122, a material exhibiting electromagnetic coupling properties, such as ferrite, may be disposed as a thin film 124 on surface of the card body 120 or may be incorporated or embedded as particles 126 in the card body 120, or both (film and particles), in any desired pattern.

The use of ferrite as a material to enhance coupling or to shield (prevent) coupling is discussed herein as exemplary of a material exhibiting high electromagnetic permeability, often being used in one form or another in conjunction with antennas. See, for example, U.S. Pat. No. 5,084,699 (Trovan).

Coil Antenna Subassembly for a DIF Chip Module

Figure 1C:
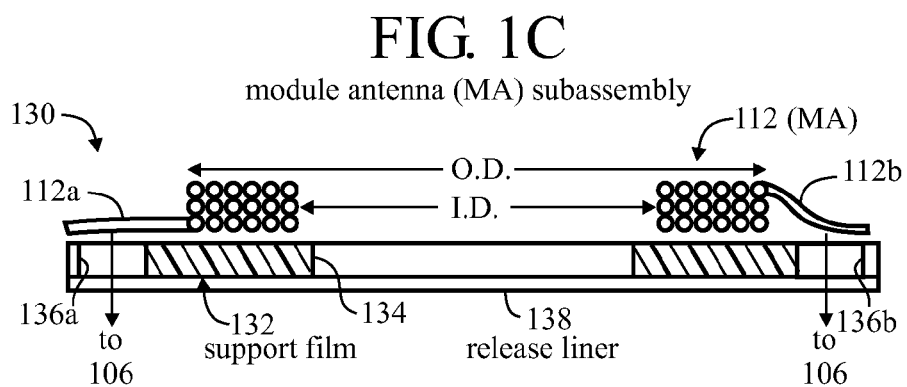
FIG. 1C is a cross-sectional view of a coil subassembly for an antenna module (AM) of a smart card, according to the invention.

FIG. 1C illustrates a construction of a coil sub-assembly 130 for a smart card such as the DIF smart card 100 of FIG. 1B. A coil of wire 112 for the module antenna (MA) may be wound, using any suitable coil-winding tool, and disposed on a film support layer 132.

The module antenna MA may comprise several turns of wire, such as in a 3×8 configuration (3 layers, each layer having 8 turns), and having two ends 112a, 112b. The wire may have a diameter of approximately 80 μm, the resulting module antenna 112 having an overall thickness (or height) of approximately 240 μm (3×80 μm). The module antenna MA may be in the form of a ring (cylinder), having an inner diameter (ID) of approximately 9 mm, and an outer diameter of approximately 10 mm.

The film support layer 132 may be nitrile film, 60 μm thick and have overall outer dimensions of approximately 10-15 mm×10-15 mm, or approximately twice as large (across, in one dimension) as the module antenna MA which will be mounted thereto.

A central opening 134 is provided through the film 132, generally aligned with the position of the module antenna MA, and having a diameter which is nearly as large as the ID of the module antenna MA. The opening 134 may be formed by a punching operation. The opening 134 is for accommodating a chip module (such as 108) and its wire bonds when the antenna module AM is assembled.

Two openings 136a and 136b may be provided (in the same punching operation as the central opening 134) through the film 132 for accommodating bonding of the antenna wire ends 112a and 112b, respectively, to the bond pads (106, FIG. 1B) on the module tape MT (102).

A release liner 138 may be provided on one side of the film 132, such as the side opposite the module antenna MA. The central opening 134 may or may not extend through the release liner 138, which may be paper, having a thickness of approximately 60 μm.

The module antenna MA may be secured to the support film 132 with an adhesive (not shown), resulting in what may be referred to as a "module antenna subassembly". A plurality of module antenna subassemblies may be prepared in an array (m×n rows and columns) of subassemblies, or on a continuous tape (1 long row) for later assembly, such as by laminating, to the module tape MT. (Invert the subassembly shown in FIG. 1C, mount to the module tape 102 shown in FIG. 1B.)

The chip module (108) may then be mounted through the central opening in the module antenna MA to the module tape (102) and connected to the bond pads (106) on the module tape as described hereinabove.

An alternative to using the "double sided" module tape MT—so called because it has metallic pads on both sides (and internal conductive vias), the module tape may be "single sided" having only metallization on side thereof, such as for the contact pads CP. For a single sided tape, openings would extend from the chip module side of the tape to underneath the back sides of the contact pads CP, for connecting thereto. (The module antenna connections can also be effected in this manner, to the exposed back surfaces of selected ones of the contact pads.)

Another DIF Smart Card

Figure 1D:
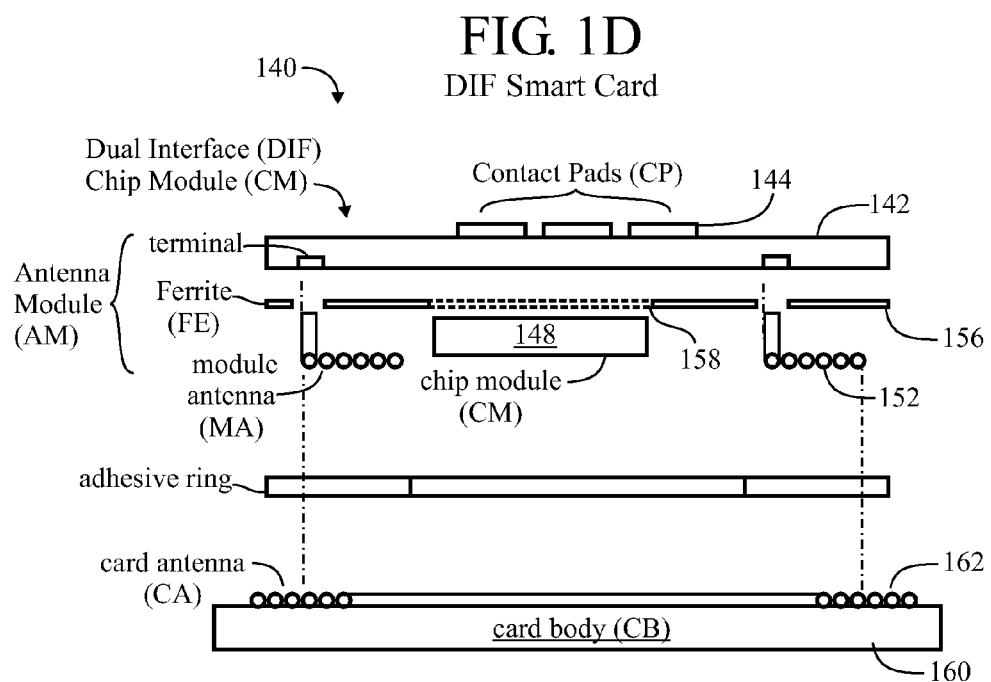
FIG. 1D is a cross-sectional view of a DIF smart card, according to the invention.

FIG. 1D illustrates an exemplary dual interface (DIF) smart card 140 wherein a DIF chip module (CM) 148 is mounted to an interconnection substrate (MT) 142 having contact pads (CP) 144 for a contact interface on one surface (top, as shown) thereof. A coil antenna (MA) 152 is provided for contactless mode, and is connected to the chip module CM via the substrate MT. The module antenna MA is typically on an opposite side (bottom, as shown) of the chip module CM than the contact pads CP. Together, the substrate MT, chip module CM, contact pads CP and coil antenna MA (and ferrite element 156, described below) may be referred to as "Antenna Module" (AM).

The Antenna Module (AM) is mounted to a card body (CB) 160 having a card antenna (CA) 162. In the contactless mode, the module antenna (MA) 152 interacts with the card antenna (CA) 162 which, in turn interacts with the antenna (not shown) of an external reader (not shown). Some particulars may include . . .
- the antenna module and module antenna are relatively small, such as 10 mm×10 mm
- the card body and card antenna are relatively large, such as 50 mm×80 mm
- the module antenna may be substantially directly over a portion of the card antenna (as shown in the figure), the remainder of the card antenna may be distant from the chip module and module antenna.
  - the card antenna may be made with conductive tracks or the like, in other words other than by embedding wire, which is the simplest "conventional" technique.

The contact pads CP on the top side of the DIF module are metallic, and therefore may attenuate RF signals passing between the module antenna MA and the card antenna CA. In order to alleviate the attenuation, and to enhance coupling between the module antenna and the card antenna (and ultimately between the chip module and an external reader), a ferrite element (FE) 156 may be disposed (interposed, inserted) between the chip module and the module antenna—or, in other words, between the contact pads (CP) 144 and the module antenna (MA) 152.

The ferrite element FE may cover an area which is at least 50% of the area defined by the chip and antenna, or by the contact pads and represents a passive magnetic element that may increase electromagnetic coupling between the module antenna MA and the card antenna CA, providing for example at least a +3 dB increase in signal strength (for signals passing between the module antenna MA and the card antenna CA, in either direction) and a consequent increase in the effective distance between the smart card 140 and an external contactless card reader (FIG. 1A), for example increasing read/write (and energy harvesting) capability from approximately 3-5 cm to approximately 6-10 cm.

The ferrite element 156 may be a separate layer of material, such from TDK or Kitagawa (see http://www.kitagawa.de/index.php?id=8&L=1). The ferrite element 156 may be sprayed onto the bottom surface of the chip module prior to installing the module antenna. The ferrite element 156 may be continuous (or contiguous, except for openings permitting connecting the antenna module through the ferrite element to the chip module), or may be discontinuous (for example, a grid or screen). As illustrated, an opening 158 in the ferrite element/layer 156 may be provided for the chip module CM to be mounted to the substrate 142. The ferrite element 156 may have a smooth surface, or may be rippled, or formed with a pattern of "corner reflectors" for enhancing coupling between the module antenna MA and the card antenna CA. The ferrite element 156 may comprise nanostructures such as nanoparticles, nanowires or nanotubes. The ferrite (or other) element 156 may be located other than between the module antenna MA and the chip module CM (contact pads CP), so long as the desired effect is achieved. Materials other than ferrite may be used for the "ferrite element". Any material, such as materials with high electromagnetic permeability, increasing the coupling (efficiency of energy transfer) between the module antenna MA and the card antenna CA may be substituted for ferrite.

The chip module of FIG. 1B may be implanted in a card body CB which may comprise a die attached and wire bonded to an epoxy glass tape and the connections encapsulated by a dam filled with a transparent UV-casting compound (epoxy resin) having a thickness above the tape of approximately 400 µm. The shape of the "Dam & Fill" area protecting the silicon die is round, having approximately a diameter of 6 mm. A ferrite element FE is mounted over the surface of the dam and surrounding area to act as a shield against the attenuation of the electromagnetic field. The wire module antenna MA is mounted onto the ferrite layer and the wire ends are connected by means of thermo compression bonding to the terminal areas on the epoxy glass tape.

In an alternative construction, the chip module CM may comprise a chip having its own antenna (such as in U.S. Pat. No. 6,373,447), either directly coupled with the card antenna CA (without a module antenna MA) or coupled with the module antenna (AM) which is coupled with the card antenna.

Figure 1E:
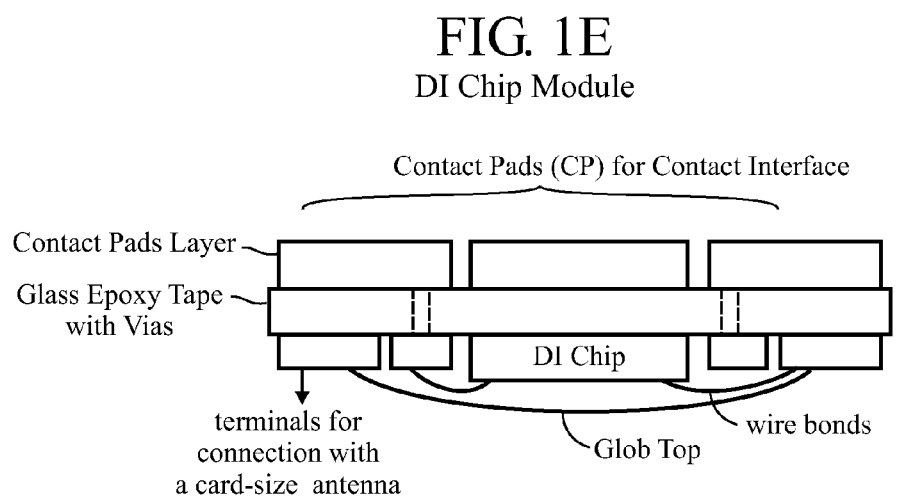
FIG. 1E is a cross-sectional view of a DI chip module, according to the invention.

FIG. 1E illustrates a conventional dual-interface chip module CM which connects directly with a card antenna (CA) disposed in a card body (CB). Contact pads (CP) are provided on a top surface of the chip module for a contact interface. Two terminals are provided on the bottom surface of the chip module for connecting with the card antenna. A dual-interface (DI) chip may be wire bonded to various contact pads on the tape substrate of the chip module. Glob-top may be applied to protect the DI chip and wire bonds.

As discussed herein, a module antenna (MA) may be provided, and incorporated with the chip module, for electromagnetically coupling the chip module to the card antenna. And, as mentioned above, ferrite may be incorporated into a resulting antenna module (AM) to improve coupling between the module antenna and the card antenna.

The module antenna MA may be a flat wound coil disposed on the glob-top mold mass of the chip module (MA).

Commercially-available chip modules (CM) or antenna modules (AM) (such as NXP SmartMx or Infineon SLE66, or other) can be used in conjunction with the present invention(s), either "off the shelf" or with some modifications that may be disclosed herein, such as adding a module antenna MA to a chip module CM, or adding a ferrite element in the resulting antenna module AM.

Figure 2A:
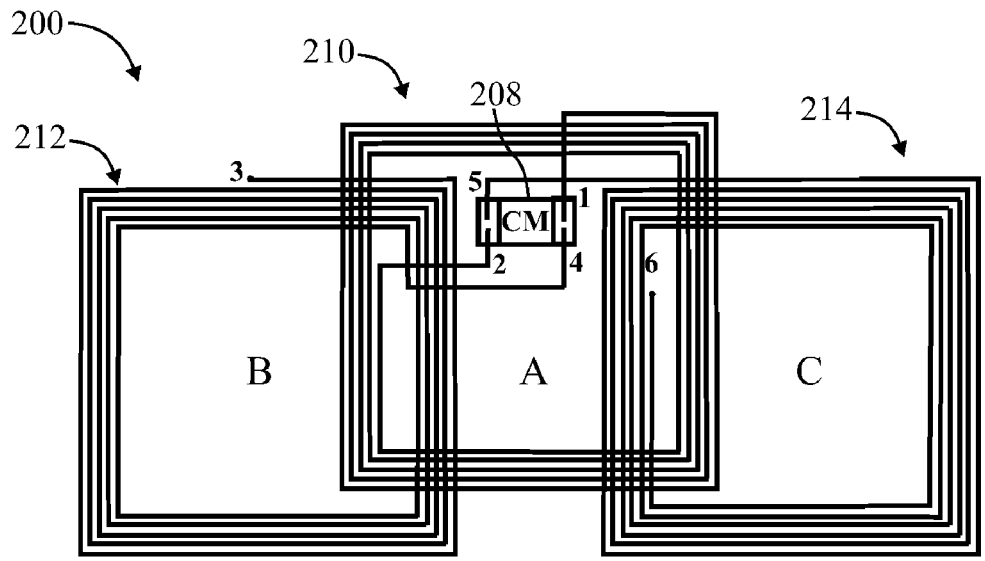
FIG. 2A is a schematic diagram of an antenna module (AM), according to the invention.
Figure 2B:
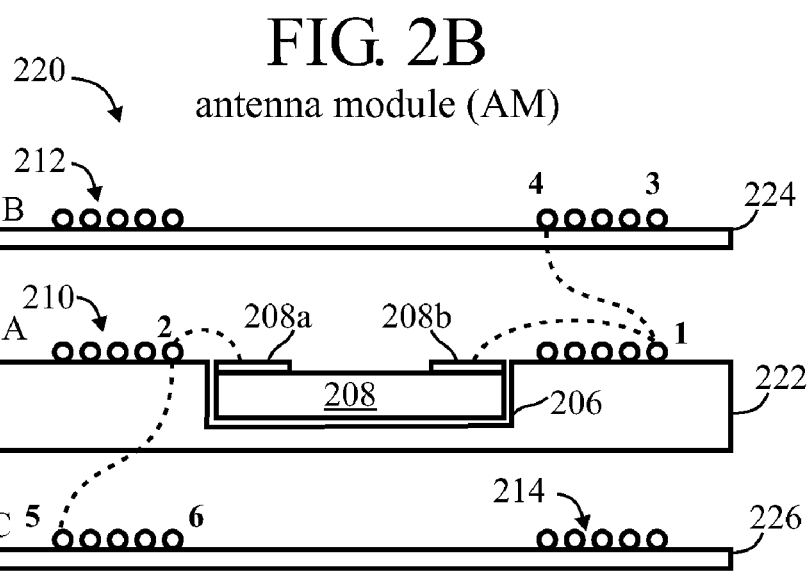
FIG. 2B is a cross-sectional view diagram of the antenna module (AM) of FIG. 2A.
Figure 3A:
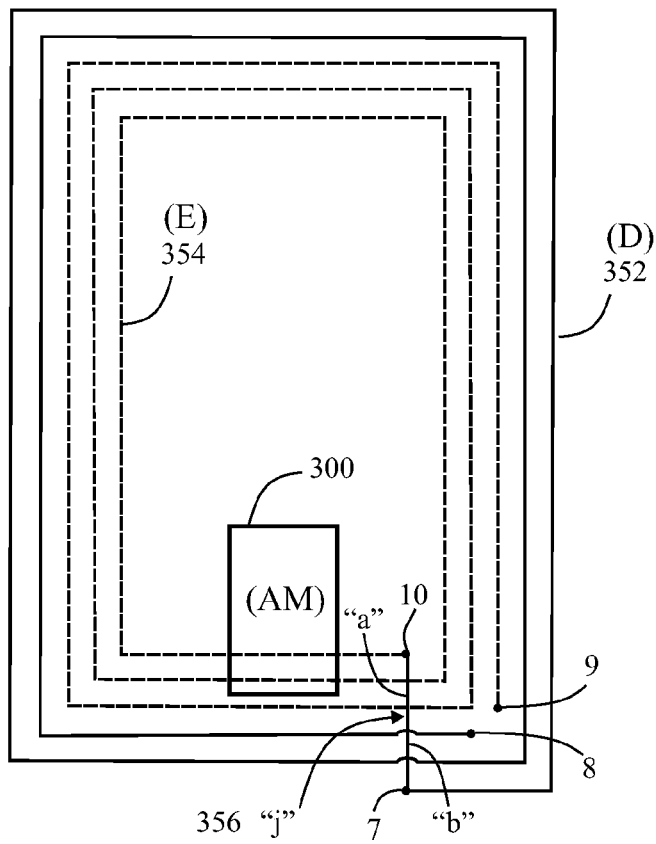
FIG. 3A is a diagram of a card antenna (CA) for a smart card, according to the invention.
Figure 3B:
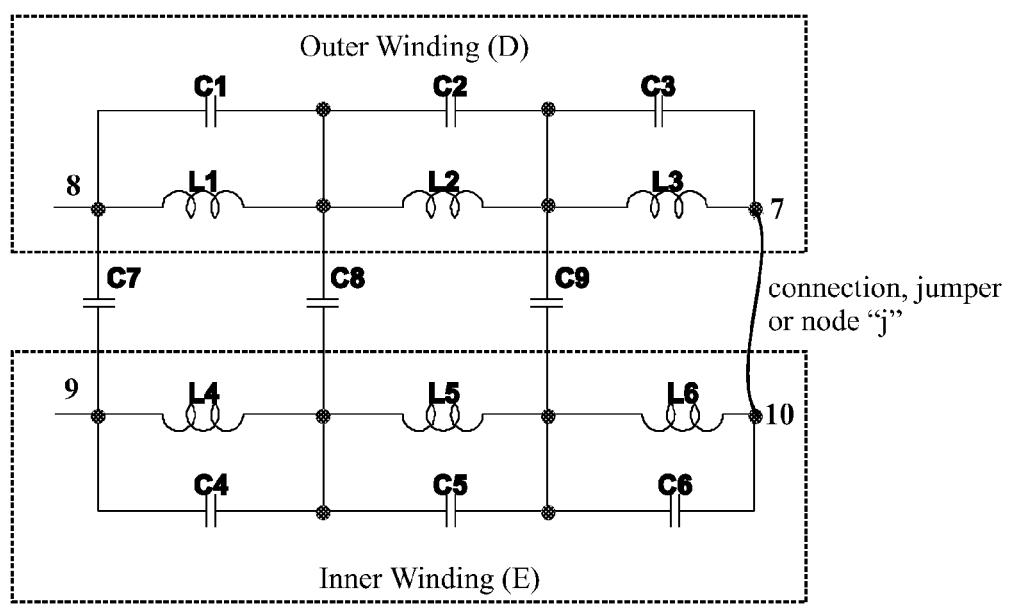
FIG. 3B is an equivalent circuit diagram of reactive components (capacitances and inductances) associated with the card antenna (CA) of FIG. 3A.

Some aspects of the invention(s) that will now be discussed include improvements to the module antenna MA (FIGS. 2A, 2B) and improvements to the card antenna (FIGS. 3A, 3B).

Capacitive Stubs for Module Antenna (MA)

FIGS. 2A, 2B illustrate an embodiment of an antenna module (AM) 200 comprising:

- a chip module (CM) 208 having two terminals 208a, 208b
- an inductive wire antenna structure (A) 210 formed as a flat coil of embedded wire having a number (such as 12) of turns, and two ends—an outer end 1 (at the end of an outer one of the turns) and an inner end 2 (at an end of an inner one of the turns).
  - The overall length of the antenna A may be 400 mm
  - The ends 1 and 2 of the antenna A may be connected to the terminals of the chip module.
  - The chip module may be disposed within (interior to) the turns of the antenna A.
  - The outer turn of the antenna A may cross over inner turns of the antenna A to be routed to the chip module CM.
- capacitive antenna extensions (or stubs, or "antenna structures") B and C also formed as flat coils of embedded wire having a number of turns, and connected to the inductive wire antenna as described below.

The chip module 208 and antenna A 210 may be disposed in or on a layer 222 of a multi-layer antenna substrate 200. The chip module 208 may be disposed in a recess (pocket) 206 extending partially through the layer 222 (as illustrated), or may be disposed in a recess (opening) extending completely through the layer 222, with the chip module 208 being supported by an underlying layer 224.

The chip module is illustrated in FIG. 2B "face up", with its terminals for connecting with the antenna A on its top side. Alternatively, the chip module may be orientated "face down" with its antenna-receiving terminals on its bottom side (and extend through the substrate 222, for example), and another set of terminals (not shown) for a contact interface on its top side.

Other variations for the AM 200 may include, but are not limited to . . .
- the antenna A may be on the bottom of the layer 222
- the stub B 212 may be on the bottom of the layer 224
- the stub C 214 may be on the bottom of the layer 226
- the stubs B and C may be on the top and bottom surfaces of a single layer which is either above or below the layer 222

The stub B 212 may be formed as a flat coil of wire having a number (such as 12) of turns and two ends—an outer end 3 of an outer turn and an inner end 4 of an inner turn—in a layer 224 overlying the layer 222. The stub B may have an overall length of approximately 400 mm, and may be aligned with (directly over) the antenna A.

The stub C 214 may be formed as a flat coil of wire having a number (such as 12) of turns and two ends—an outer end 5 of an outer turn and an inner end 6 of an inner turn—in a layer 226 underlying the layer 222. The stub C may have an overall length of approximately 400 mm, and may be aligned with (directly under) the antenna A. The stub C may be aligned with (directly under) the stub B. The stubs B and C may be formed by etching, printing, or other processes, instead of (other than) using embedded wire.

In the schematic view of FIG. 2A, the antenna A and stubs B, C are shown laterally offset from each other. In FIG. 2B, the inductive wire antenna A and capacitive antenna extensions B and C are shown positioned and aligned atop one another. As best viewed in FIG. 2A, the antenna structures A, B, C may each be formed in a flat coil pattern having a number of turns, an overall length (from end to end), and a footprint (length×width), and may be substantially identical with one another in these regards. As best viewed in FIG. 2B, the antenna structures A, B, C may be disposed substantially directly over one another.

FIG. 2B illustrates that the number of turns, length, width, pitch and pattern of the stubs B, C may be substantially the same (match) as each other and they may be aligned one atop the other in layers of the antenna module 200 so that their turns are aligned with one another, turn-for-turn. The stubs B, C may also substantially match and be aligned with the antenna A. Capacitance and the resonant circuit is formed between A+B and A+C. Antenna A is shown disposed in a layer between the layers for stubs B and C. Antenna A could alternatively be disposed in a layer above or below both of the layers for stubs B and C.

Dashed lines (- - -) indicate that the inner end 4 of the stub B 212 may be connected to the outer end 1 of the antenna A 210, such as at the terminal 208b, and the outer end 5 of the stub C may be is connected to the inner end 2 of the antenna A, such as at the terminal 208b. The outer end 3 of the stub B and the inner end 6 of the stub C may be left unconnected (remain open).

Alternatively, the vertical arrows (↓,↑) indicate that the outer end 3 of the stub B may be connected to the outer end 1 of the antenna A (such as at terminal 208b), and the inner end of stub C may be connected with the inner end of the antenna A.

Note that in either case, "opposite" (inner versus outer) ends of the stubs B, C are connected to the two ends 1, 2 of the antenna A—in other words, the inner end 4 of B and the outer end 5 of C. As used herein, "connected in an opposite sense" means that the inner end of one of the two stubs (B or C) is connected with one end of the antenna (A), and the outer end of the other of the two stubs (C or B) is connected with the other end of the antenna (A). It is generally not desirable that the "same" (such as both inner) ends of the stubs are connected with the ends of the antenna A. The connections (interconnects) discussed herein can be made in any conventional manner, such as by vias through layers, traces on layers, bonding, soldering, crimping, welding, etc.

Locating the stubs B and C over each other in close proximity with the antenna A between them forms additional resonant circuits between the A and the stubs B, C realized by the stray capacitance between the antenna structures A, B, C. The interaction between the coupled stubs B and C exposed to the same electromagnetic field from the antenna A may advantageously reduce the self-resonance (or self-resonant) frequency of the antenna A. Stub B is close to antenna A and stub C is close to antenna A, ergo stub B is close to stub C.

In electronics, capacitors and inductors have parasitic inductance and capacitance, respectively. For a capacitor, the inductance is primarily due to the physical dimensions including the leads. Since a capacitor and inductor in series creates an oscillating circuit, all capacitors and inductors will oscillate when stimulated with a step impulse. The frequency of this oscillation is the self-resonant frequency (SRF).

The dimensions of the antenna module AM may be approximately 10-15 mm×10-15 mm, and it may of course be round, rather than rectangular. Due to the relatively small available area, an inductive wire loop of the size of the antenna module may have a self-resonance frequency of approximately 75 MHz. The over-layered close-coupled antenna structures (stubs B and C) may function as a wire formed capacitor—with open wire ends (3 and 6)—that may reduce the resonance frequency of the formed transponder to a more desirable value of approximately 13~17 MHz, thereby increasing the voltage and transferred power to the chip module.

This principle of over-layered close-coupled wire (or other conductive trace) antenna structures (stubs B and C) facilitates reducing the space consumption of the antenna A to a minimum, by moving the additional wire turns of structures (stubs) B, C to separate planes. This principle may be more efficient than connecting a number of inductive wire antennas (with all wire ends connected) in series or in parallel. Capacitive extensions for the antenna A could be formed by creating more conventional conductive surfaces (plates) to offset the resonant frequency. An advantage of using wire is ease of creation using wire embedding technology, and better utilization of space. The antenna module may have very limited space restrictions.)

Various alternatives to the "solution" discussed above may include, but are not limited to
- having the two stubs B and C in the same layer as one another, but with their turns interleaved with one another,
- having one or both of the stubs B and C in the same layer as the antenna A,
- having the two stubs B and C in the same layer as one another, but both on the same side of (i.e., overlying or underlying) the antenna A.
- connecting the outer end 3 instead of the inner end 4 of the stub B to the outer end 1 of the antenna A, and connecting the inner end 6 instead of the outer end 5 of the stub C to the inner end 2 of the antenna A,
- having only one stub (B or C) connected by either its outer or inner end (one only) to the outer or inner end (one only) of the antenna A, and it may generally be preferred to connect the ends opposite-wise (outer end of one to inner end of the other), although connecting likewise (inner end to inner end, or outer end to outer end) is also possible.

"Quasi-Dipole" Card Antenna (CA)

FIG. 3A illustrates a card antenna 350 in the overall form of a substantially planar, generally rectangular spiral of wire embedded in a card body (CB, not shown) and comprising two distinct portions (or windings, or antenna structures, or "poles") 352, 354, as follows:
- an outer winding (D) having a few turns of wire, an outer end 7 and an inner end 8
- an inner winding (E) having a few turns of wire, an outer end 9 and an inner end 10
  - note that the inner winding E is shown as a dashed line, for illustrative contrast with the outer winding D (solid line).
- each of the outer portion D and inner winding E may have an overall length of approximately 1200 mm. The inner and outer winding have substantially the same length as one another.
- The inner winding E and the outer winding D are both considered to be "antenna structures" for the card antenna CA. (Compare "antenna structures" A, B, and C for the module antenna MA.)

The inner winding E and the outer winding D are connect as a "quasi dipole" with "reverse phase". The outer end 7 of the outer winding D is connected with the inner end 10 of the inner winding E, in any suitable manner, such as by using a separate jumper or conductive trace within the substrate. The connection "j", is labeled 356, and may simply be a node. The inner end 8 of the outer winding D and the outer end 9 of the inner winding E are left unconnected.

The inner and outer windings E,D may be coupled in close proximity and voltages induced in the inner and outer windings E,D have opposite phase from one another, may be formed in the same layer as one another with the inner winding E disposed interior of the outer winding D, may be formed in layers overlying each other, substantially aligned with one another, may be formed as flat coils of embedded wire, or other than embedded wire, having a number of turns and an overall length of approximately 1200 mm.

The coupling antenna 350 may be formed in a substrate (or card body) using conventional wire embedding techniques (a sonotrode with ultrasonic, such as described in U.S. Pat. No. 6,233,818), for example as follows:
- start embedding the wire at the position 9 (outer end of inner winding E) and continue embedding to the position 10 (inner end of inner winding E), thus forming the few (such as 2, 3 or 4) turns of the inner antenna winding E
- stop embedding (turn off the ultrasonics, lift the sonotrode), and in a next step, route (guide) the wire over the turns of the inner winding E to the position 7, which will be the outer end of the outer winding D, without cutting the wire.
  - This jumping over the inner winding E eliminates the need to have a separate connection bridge or jumper connecting end 10 of the outer winding D with inner end 7 of the inner winding E. (here, "7" and "10" are positions, not ends.)
- resume embedding at the position 7 (the outer end of the outer antenna structure), and continue, forming the few (such as 2, 3 or 4) turns of the outer antenna structure (D), jumping over the already-laid integral jumper 356 as may be necessary.

As illustrated, a portion "a" of the wire forming the connection "j" may pass over the two (as illustrated) already-laid turns of the inner winding E, and a portion "b" may pass under the two (as illustrated) to-be-laid turns of the outer winding E. (D), all of this happening at the bottom of the pattern (essentially a common position vis-à-vis each of the turns, i.e., at "6 o'clock"). Regarding the wire connection "j" passing under the turns of the outer antenna structure, it will be understood that the wire connection "j". may simply be embedded in the surface of the substrate (card body), and as the turns of the outer winding D are laid, embedding temporarily ceases so the turns can jump over the embedded wire connection "j". The outer end 9 of the inner winding E and the inner end 8 of the outer winding D may be left open (not connected with anything).

The portion "b" of the wire connection "j". which passes under the turns of the outer antenna structure D may be laid in a channel previously formed in the substrate (card body), such as by laser ablation, which may obviate the need to turn off the ultrasonics during laying the outer antenna structure to jump over the wire connection "j".

By connecting the outer winding D and inner winding E in this manner (inner end 10 of inner winding E to outer end 7 of outer winding D, or "reverse phase"), the inner and outer windings are coupled in close proximity and the effect is additive since the induced voltage of the inner winding E has opposite phase (phase inversion) than the voltage induced in the outer winding D. Reactive coupling (capacitance and inductance) of the inner winding E and the outer winding D permits the card antenna CA to be realized with fewer turns than would otherwise be possible.

The connection of an inner and outer winding (E and D) to form a "quasi-dipole" card antenna exhibiting phase inversion is easily contrasted with either of U.S. Pat. No. 6,378,774 (Toppan) and US2009/0152362 (Assa Abloy).

Note, for example, in Assa Abloy, which discloses two "extremity sections" 11 and 11' (corresponding to the outer winding D and inner winding E), the outer end of the outer extremity section 11 and the inner end of the inner extremity section 11' (corresponding to the ends or positions 7 and 10 of the card antenna CA) are left unconnected. The inner end of the outer extremity section 11 and the outer end of the inner extremity section 11' (corresponding to the ends 8 and 9 of the card antenna CA, which are left unconnected) are connected with a central section 12 forming at least a small spiral for inductive coupling with the transponder device (corresponding to the antenna module AM). Note in FIG. 3A that there is no analogous coupling coil, coupling is effected by disposing the antenna module AM directly over (onto) a portion of the card antenna CA, as discussed in greater detail hereinbelow.

Toppan also requires a separate coupling coil (3)

The inner winding E and the outer winding D may be formed as one continuous structure, without a separate jumper or trace, using conventional wire embedding techniques, for example as follows:

start embedding the wire at the position 9 (outer end of inner winding) and continue embedding to the position 10, thus forming the few (such as 2, 3 or 4) turns of the inner winding (E)

stop embedding (turn off the ultrasonics, lift the sonotrode), and in a next step, route (guide) the wire over the turns of the inner winding (E) to the position 7, which will be the outer end of the outer winding (D), without cutting the wire. This jumping over the inner antenna winding E eliminates the need to have a separate jumper connecting the ends 7 and 10 of the outer and inner windings. Here, "7" and "10" represent positions corresponding to respective outer and inner ends of the outer and inner windings.

The portion of wire between positions 7 and 10 may be referred to as a "connection bridge" or "integral jumper" 356. (And, as mentioned, if the two windings D and E are not integral with one another, a separate "jumper" would be used to connect the ends 7 and 10.)

after jumping over the inner winding E, resume embedding at the position 7, and continue, forming the turns of the outer antenna winding D, jumping over the already-laid connection bridge 356 as may be necessary.

Note in the figure that a portion "a" of the connection bridge 356 passes over the turns of the inner winding E, and a portion "b" of the connection bridge 356 passes under the turns of the outer winding D.

The portion "b" of the connection bridge 356 which passes under the turns of the outer winding D may be laid in a channel previously formed in the substrate (card body), such as by laser ablation, which may obviate the need to turn off the ultrasonics during laying the outer antenna winding D to jump over the connection bridge 356.

The card antenna CA may comprise insulated 80 μm copper wire (Ø: 80 μm), 46 mm×76 mm (slightly smaller than the card), pitch of the turns 300 μm, resonant frequency 13.56 MHz.

In combination with a commercially-available chip module (such as NXP SmartMx or Infineon SLE66, or other) which may be specified with an input capacitance of approximately 10~30 pF the assembled transponder can be matched to a resonance frequency of 13~17 MHz. See, for example, the following, incorporated by reference herein:

Product short data sheet, P5CD016/021/041/051 and P5Cx081 family, Secure dual interface and contact PKI smart card controller, Rev 3.2—March 2011, 20 pages Preliminary Short Product Information, SLE 66CLX360PE(M) Family, 8/16-Bit Security Dual Interface Controller For Contact Based and Contactless Applications, Infineon, November 2006, 14 pages SLE 66 CX126PE, short Product Overview, May 2010, 4 pages SmartMX for programmable high-security, multi-application smart cards, NXP, 2009, 2 pages, mifare DESFire Data Sheet Addendum, Preliminary specification, Revision 2.0, April 2003, 7 pages M086820_MF3ICD40_ModuleSpec FIG. 3B illustrates, schematically, the card antenna 350 consisting of an outer winding D and an inner winding E, and is intended as a non-limiting example for describing how the card antenna may function. In this example, the outer winding D has 3 turns modeled by inductances L1, L2 and L3, and the inner winding E has 3 turns modeled by inductances L4, L5 and L6. All inductances (L) are influenced by the coupling between all coils. The capacitances C1~C6 are the coil inherent stray capacitances.

The capacitances C7~C9 describe the interaction between the two windings D and E, in case of tight coupling between the inner and outer windings. These additional capacitances reduce the self-resonance frequency of the card antenna (CA) and may make an additional capacitive component unnecessary.

The capacitances (C) can be influenced by wire pitch, the inductances (L) by the number of turns.

By way of example, the self-resonant frequency of the card antenna 350 is created by the stray capacitance forming between the windings D and E, taken alone without interfering each other). Having only one winding structure (rather than two) would result in a higher than desired self-resonant frequency, such as approximately 40~50 MHz. The self-resonant frequency may be reduced by (1) increasing numbers of turns (inductance) or (2) increasing of capacity (reducing wire pitch). Increasing numbers of turns increases inductance and lowers self-resonant frequency. In the case wire ends 8 and 9 are connected and 7 and 10 remain open, a standard coil would be formed with the number of both wire structures added. This would result in a certain self-resonant frequency (e.g. 50~60 MHz). Connecting the windings D and E as shown reduces the self-resonant frequency to approximately 13~17 MHz with the same number of turns or length of wire.

Configurations of the Antenna Module AM and Card Antenna CA

The technical attributes of how the module antenna MA of the antenna module AM interacts with the card antenna CA, and how the card antenna CA may be configured with two windings connected with "reverse phase" to form a "quasi dipole" antenna have been discussed above. Various particular configurations (arrangements) for the card antenna CA will now be described. In each case, the card antenna CA is generally in the form of a rectangular spiral extending around the perimeter of the card body CB. In some of the figures, the card body CB may be omitted, for illustrative clarity. The card antenna is intended to work with an antenna module functioning in the contactless mode, including but not limited to DIF modules, and also including semiconductor chips having their own "on chip" antennas (such as disclosed in U.S. Pat. No. 6,373,447).

In all but one of the illustrated configurations described herein (the exception being FIG. 4C), the card antenna CA is in the form of a "quasi-dipole" having two interconnected windings (or "poles"). These two windings should have substantially the same number of turns, the same length and the same pitch as one another, and be spaced as closely as possible to each other over much of their perimeter. They may be wound with the same "sense" (clockwise or anti-clockwise). Variations in any of these parameters (length, pitch, spacing, sense) are of course possible, some of which are discussed herein.

Figure 4A:
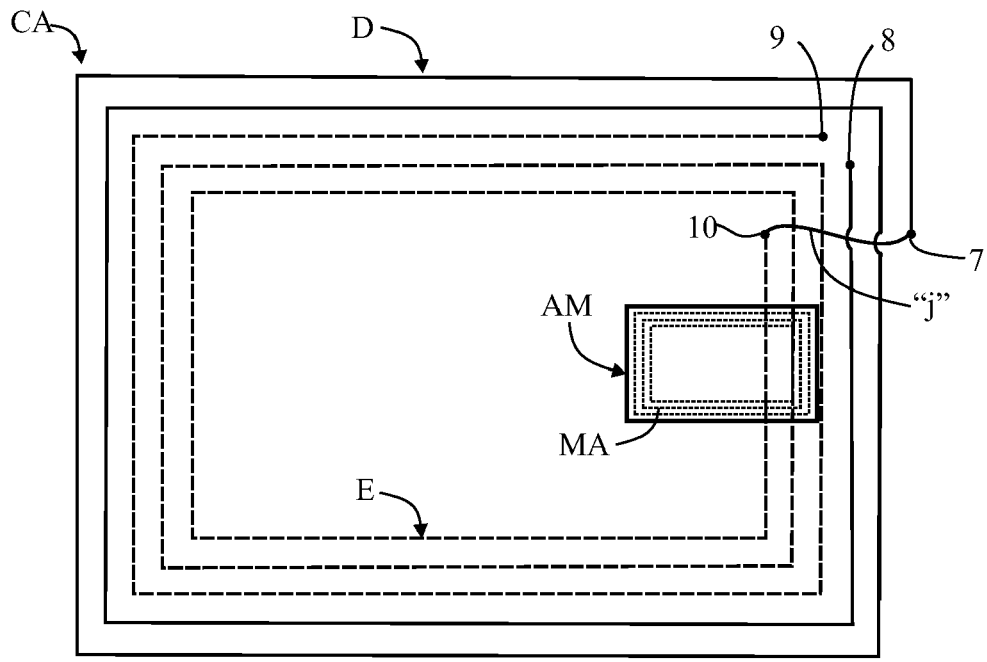
FIG. 4A is a diagram (plan view) of a configuration of a card antenna CA, according to some embodiments of the invention.
Figure 4B:
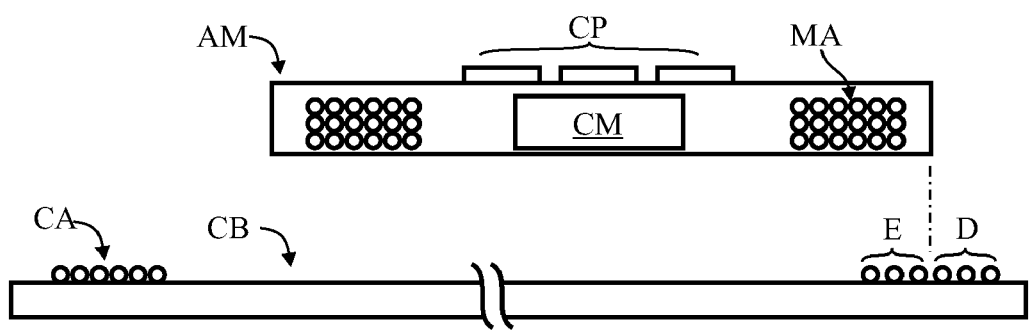
FIG. 4B is a cross-sectional view of the configuration shown in FIG. 4A.

FIGS. 4A, 4B show the card antenna CA with an exemplary antenna module AM positioned for coupling with the card antenna CA. The antenna module AM comprises a DIF chip module CM and module antenna MA for contactless mode, and contact pads CP for contact mode. A card body CB is provided with the card antenna CA, which may be a two-winding "quasi-dipole" having an inner winding E and an outer winding D, as described above. (The line "j" designates a connection of the inner end 10 of the inner winding E with the outer end 7 of the outer winding D, as discussed above.) The card antenna CA may be formed using 112 μm self-bonding wire, or may be formed as conductive traces using any additive (such as printing) or subtractive (such as etching) processes.

The antenna module AM is generally rectangular, having four side edges. The module antenna MA is also generally rectangular, having four side edges. The card antenna CA is also generally rectangular, having four side edges.

It should be understood, throughout all of the descriptions set forth herein, that the various "rectangular" antenna structures (A, B, C, D, E, MA, CA) will normally have rounded edges, also that the module antenna MA may be formed as a round coil or may simply be round or oval.

The antenna module AM is disposed (positioned in the smart card) so that the at least one of the four side edges of the module antenna MA overlaps at least some of the turns of only the inner winding E of the card antenna CA, for efficient coupling thereto (preferably without also overlapping any of the outer winding D). No separate coupling coil is required.

The antenna module AM, particularly its module antenna MA, may overlap the outer winding D rather than the inner winding E. However, it is important that the antenna module AM, particularly its module antenna MA, does not overlap both of the inner winding E and outer winding D.

The unconnected ends 8 and 9 of the card antenna CA may be located nearby each other in the middle between the inner winding E and the outer winding D. Through the connection of the two windings by the wire jumper (or strap), the card antenna forms a resonance circuit for the operating frequency (approx. 13~17 MHz).

The connection "j" forces the electrical potential of points (or ends) 7, 10 to the same level. When the inner winding E and outer winding D are exposed to the same magnetic flux of a reader (FIG. 1A), the voltages of the windings are added. The arrangement of the two windings is important, and the connection "j" causes a phase inversion and has an additive effect.

The optimized self-resonance frequency of the card antenna CA may be approximately 13~17 MHz, which may create the closest coupling between the card antenna CA and the module antenna MA, resulting in enhanced (increased) read/write distance with respect to an external reader.

The arrangement of the antenna module AM with its module antenna MA physically overlapping and directly coupling to a two winding card antenna CA is in stark contrast with U.S. Pat. No. 6,378,774 (Toppan) and US2009/0152362 (Assa Abloy), both of which rely on a separate coupler coil in addition to a two winding card antenna to effect coupling with the module antenna. This direct coupling feature of the invention is attributable to the way the inner winding E is connected with the outer winding D so that they are "reverse phased", and overlapping the module antenna MA onto only one or the other of the inner and outer windings.

Figure 4C:
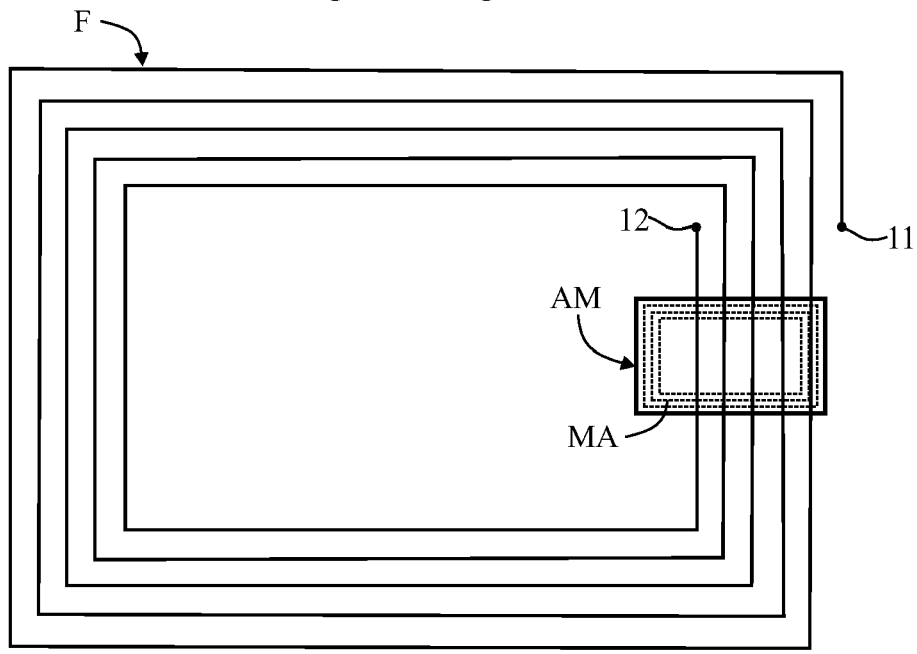
FIGS. 4C, 4D, 4E, 4F, 4G, 4H are diagrams (plan view) of configurations of a card antenna CA, according to some embodiments of the invention.

FIG. 4C shows a variation of the card antenna, here designated "F" (rather than CA), having only one continuous coil of wire (rather than two windings) and having two ends 11 and 12 which are left unconnected. The antenna module AM with its module antenna MA is positioned to overlap at least one of the side edges of the card antenna F. In this illustration, the module antenna MA overlaps all of the turns of the card antenna F.

Generally, this single winding configuration may require more (such as 20) turns of wire to be as effective as the "quasi dipole" configurations which may have only 3 or 4 turns for each of the inner winding E and outer winding D. More turns require more area, which can be a problem for smart cards. More turns also results in a stiffer antenna structure, which may cause mechanical problems such as microcracking in the card body CB. For electronic passports, the single winding configuration may be more practical than for smart cards. In any of the embodiments of card antenna CA disclosed herein, the wire may be "meandering" to address some of these problems.

Coatings, such as in the form of particles or nanoparticles can be applied to one or both sides of a such as the card body CB. (See FIG. 1B, coating 124). Conductive coatings can be applied to form capacitances, and can be applied to be in contact with portions of the inner E and outer D windings. Such additional capacitances may improve performance of the card antenna CA. This may be particularly beneficial with the single winding configuration of FIG. 4C, to reduce the number of turns required.

Figure 4D:
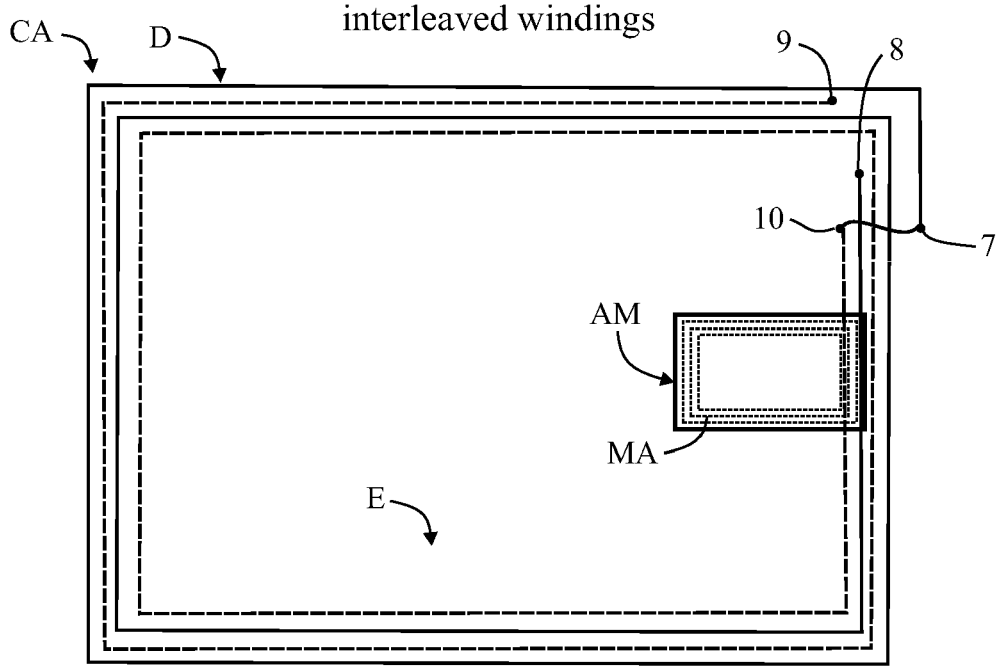

FIG. 4D shows a variation of the card antenna, designated CA, which is similar to the card antenna CA of FIG. 4A, except that here the two windings E and D are interleaved with one another, rather than the one winding E being disposed entirely inside of the other winding D. The ends 7, 8, 9, 10 of the windings D and E are comparable to the ends 7, 8, 9, 10 of the windings D and E of the card antenna CA of FIG. 4A, and are connected so that the card antenna CA is similarly configured as a "quasi dipole".

Because of the interleaving of the windings D and E, it is not efficient or effective to overlap only one or the other with the antenna module AM.

Figure 4E:
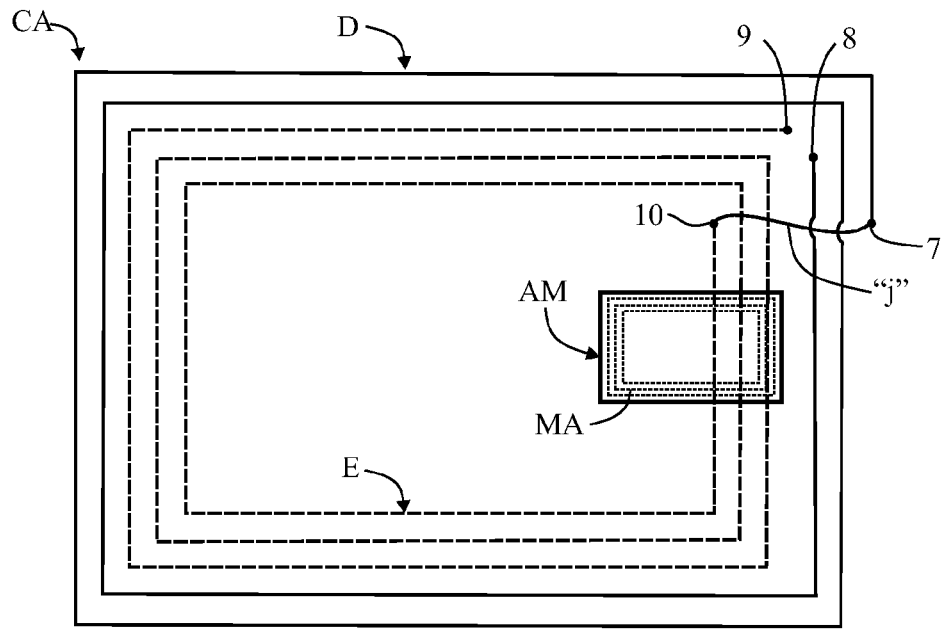

FIG. 4E shows a variation of the card antenna CA where at least a portion of the inner winding E is spaced further apart from the outer winding D where the antenna module AM will be overlapping the card antenna CA. Here, an entire side (right, as viewed) of the inner winding E is spaced farther from the outer winding D than the other three sides of the inner winding E.

This increased spacing makes it easier to position the antenna module AM so that its module antenna MA overlaps all of the turns of the inner winding E without overlapping any of the turns of the outer winding D. However, increasing the spacing between the inner winding and the outer winding may cause some loss of efficiency.

Figure 4F:
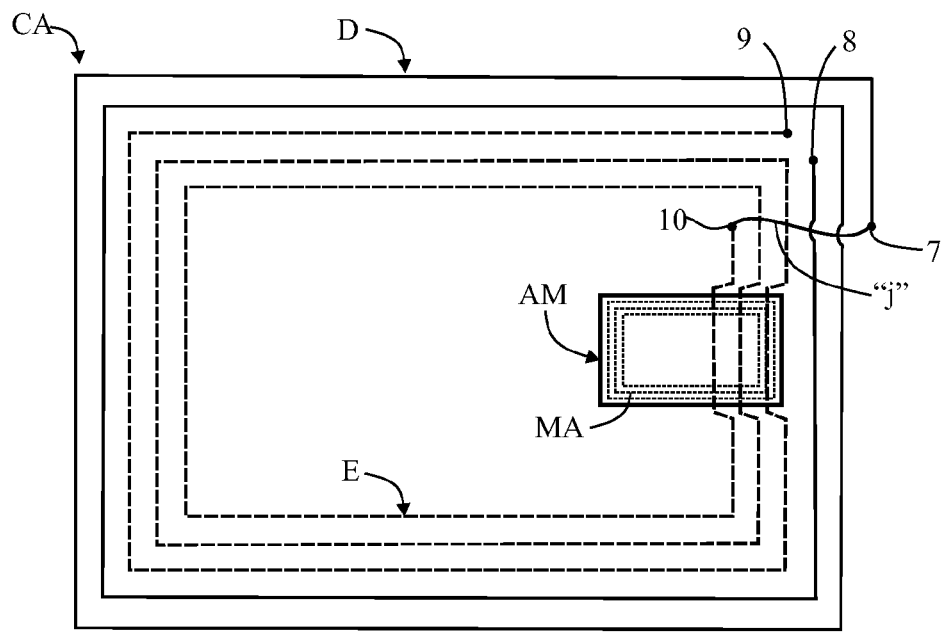

FIG. 4F shows a variation of increased spacing. Here, rather than an entire side of the inner winding E being spaced farther from the corresponding side of the outer winding D, only a relatively small portion of the side (here shown as the bottom side) of the inner winding is caused to be farther away from the outer winding D, only where the antenna module AM needs to overlap for coupling of the module antenna MA to the inner winding E of the card antenna CA.

An advantage of this arrangement is preserving the desirable close spacing of the winding E and the winding D over most of the card antenna CA. (The spacing is compromised only specifically where the module antenna MA will be interacting with the card antenna CA.)

Figure 4G:
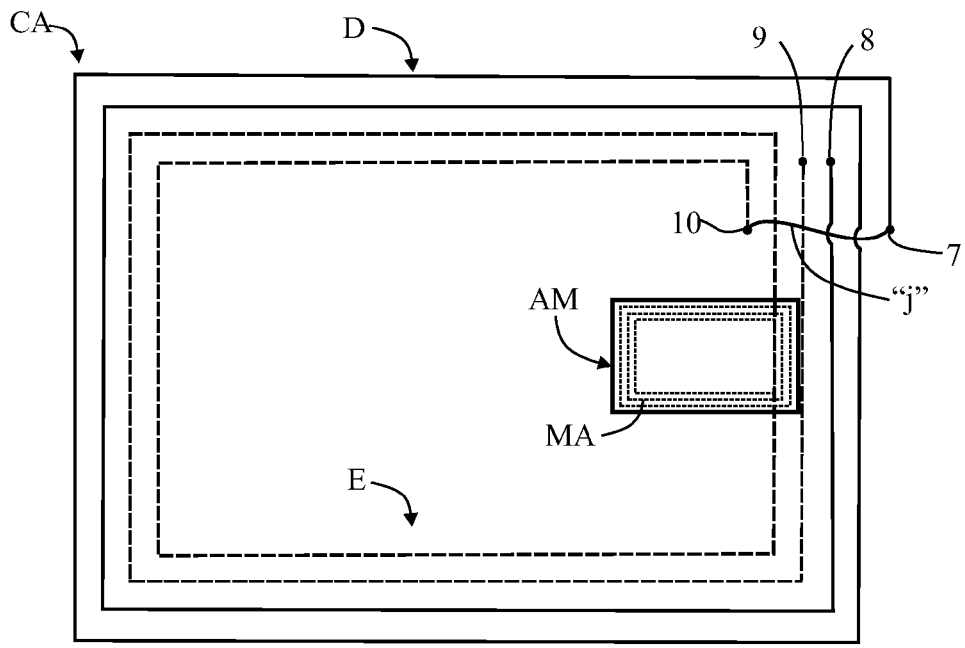

FIG. 4G illustrates a variation wherein rather than the inner and outer windings having the same "sense" (such as both anti-clockwise, as in FIG. 4A), the inner and outer windings of the card antenna CA are formed having an opposite sense from one another. Here, the outer winding D is formed (from end 7 to end 10) with an anti-clockwise sense, and the inner winding E is formed (from the end 9 to the end 10) with a clockwise sense. Otherwise, the "7/10" connection of the outer end 7 of the outer winding D to the inner end 10 of the inner winding E is the same as before (FIG. 4A), and the inner end 8 of the outer winding and the outer end 9 of the inner winding E are left unconnected, as before.

Theoretically, a single coil can form a resonant circuit without a capacitor because of the stray capacitance between the windings. However, this configuration may increase the resonance frequency of the card antenna CA to a level which is not beneficial at 13.56 MHz operation.

Figure 4H:
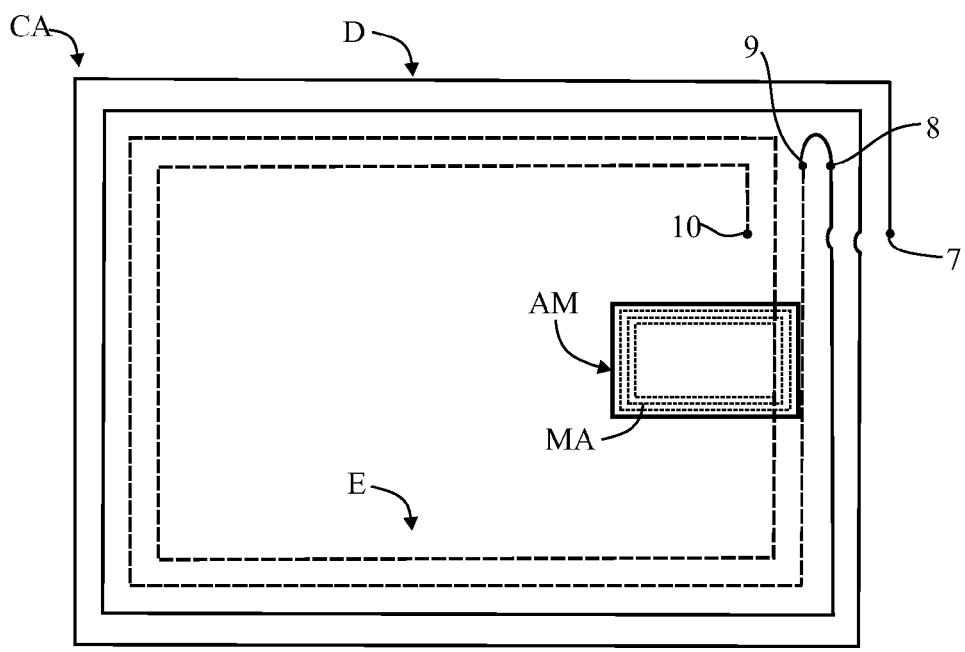

FIG. 4H illustrates a variation wherein the ends of the inner and outer windings are connected opposite to how the are connected in previous examples (inner end of inner winding to outer end of outer winding). Based on the "opposite sense" configuration of FIG. 4G, here the inner end 8 of the outer winding D is connected with the outer end 9 of the inner winding, and the outer end 7 of the outer winding D and the inner end 10 of the inner winding E are left unconnected. The connection "8/9" can be made while laying (embedding) the wire, just by making a "U-turn", so that the card antenna (CA) is one uninterrupted length of wire (mentioned previously as an alternative to a separate jumper joining the two windings, in the discussion of FIG. 3A). Alternatively, after laying the outer winding D, from point 7 to point 8, make a U-turn and return interleaved.

This configuration may increase the resonance frequency of the card antenna CA to a level which is not beneficial at 13.56 MHz operation.

Figure 4I:
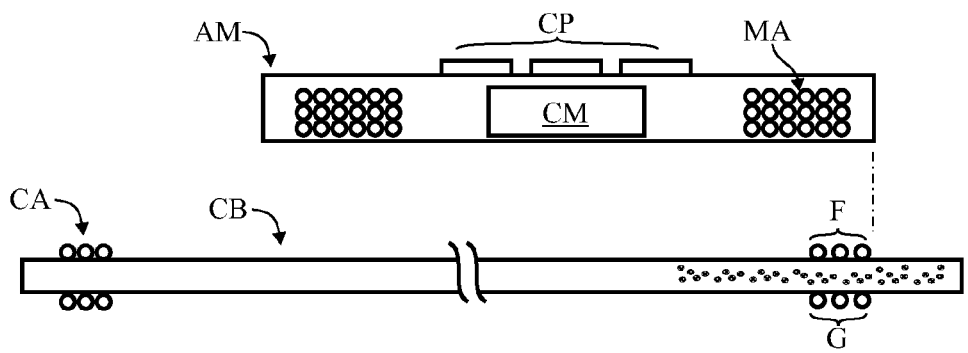
FIGS. 4I, 4J are cross-sectional views of smart cards with configurations of a card antenna (CA), according to some embodiments of the invention.

FIG. 4I illustrates a variation wherein the two windings of the "quasi-dipole" card antenna CA are stacked one atop the other, such as one winding F on a top surface of a layer of the card body CB and the other winding G on a bottom surface of the layer. In other words, here the two windings F and G are in clearly different planes, whereas in previous embodiments the windings D and E were in substantially the same plane. As in previous examples, the two windings F and G are similar to one another, and may be connected (not shown) with "reverse phase".

Recalling that it is desirable for the antenna module AM to interact (via its module antenna MA) with only one of the two windings of the "reverse phase" connected "quasi dipole" card antenna CA, this result may be obtained by providing a shielding material, such as ferrite, between the module antenna MA and the winding of the card antenna CA desired to be shielded, while the other winding of the card antenna CA is not shielded. This can be accomplished by providing ferrite particles in the card body CB, at least at the location where the antenna module AM will be positioned atop the card body CB. Alternatively, a layer of ferrite material could be disposed between the top surface of the card body CB and the winding F, below the top winding F. This allows for and may also tend to increase coupling of the module antenna MA with the winding F on top of the card body CB, while attenuating coupling with the winding G below the card body CB.

The thickness of the substrate determines the permeability and therefore the efficiency of the coupling effect between the two windings F and G. The dielectric medium may be a polymer like polycarbonate or Teslin™.

Figure 4J:
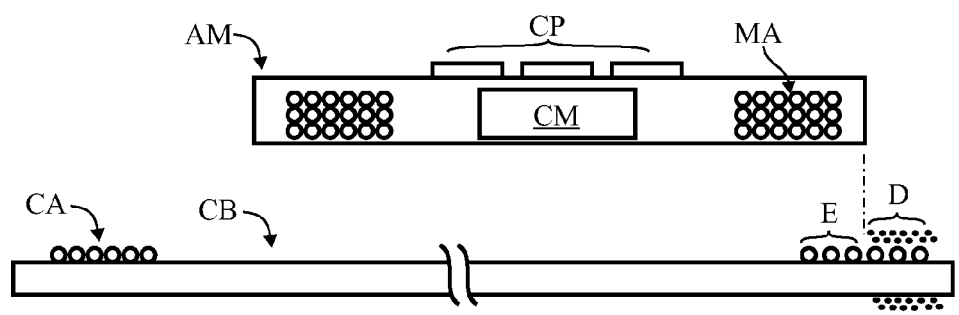

FIG. 4J illustrates another example of shielding one of the two windings of a "quasi-dipole" card antenna CA. In this case, the windings may be inner and outer, as described with respect to FIG. 4A, and both disposed on the top surface of the card body CB. The inner winding E is interior the outer winding D.

A shielding material such as ferrite may be selectively applied over the outer winding D at a location where the antenna module AM may otherwise interact with the outer winding D.

Additional ferrite material may be applied under the card body CB at the same location to further minimize undesirable coupling of the antenna module with the outer winding D.

In these "shielding" embodiments of FIGS. 4I, 4J, the shielding material should only be applied at a location on the card body CB or the bottom or outer winding (G or D, namely the winding with which it is sought to minimize coupling with the module antenna MA), and it should generally be avoided to shield the remaining majority of the bottom or outer winding (G or D) since the bottom or outer winding serves an important role in coupling with an antenna of an external contactless reader (refer to FIG. 1A).

Additional Configurations for the Card Antenna CA

In the various configurations described hereinabove, the card antenna CA is substantially in the form of a planar, rectangular spiral (with the exception of the configuration in FIG. 4I where two planes are established), and one side edge of the antenna module AM overlaps at least a portion of the card antenna CA, generally only one of the two windings thereof. Some additional configurations for the card antenna for improving coupling will now be described wherein (generally)

(i) the antenna module AM may overlap the outer winding D (rather than the inner winding E) of the card antenna CA (ii) two or more edges of the antenna module AM may overlap one (or the other) of the two windings (D or E) of the card antenna CA (iii) two or more antenna modules may be provided in the smart card, each interacting with the card antenna CA, and possibly with each other.

In the embodiments described below, antenna modules AMs will be shown on a card body CB with "simplified" showings of the card antenna CA. Some details, such as the interconnection of ends of the inner and outer windings may be omitted, for illustrative clarity.

It should be understood that any suitable contactless (or DIF) antenna module AM (or chip module, or chip with integrated antenna) may be used to interact with the exemplary configurations for the card antennas CA, including commercially-available antenna module products which may only the antenna A (without the capacitive stubs B, C).

The various patterns for antenna structures (A,B,C,D,E) are shown as "generally rectangular". It should be understood that other patterns may be suitable, such as oval to avoid sharp corners, or zigzag (meandering) to increase the overall length of the antenna structures, alleviate increasing stiffness of the card body CB, and the like.

Figure 5A:
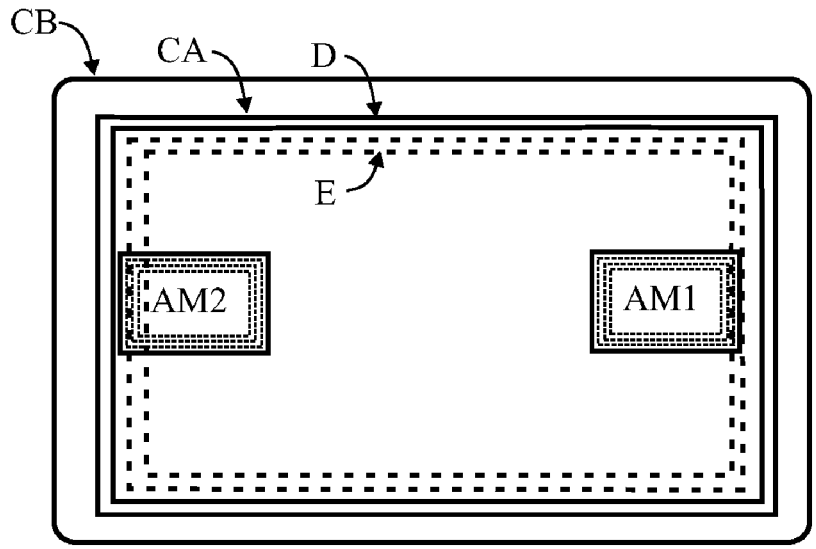
FIGS. 5A, 5B, 5C, 5D, 5E, 5F, 5G, 5H are diagrams (plan view) of various configurations for the card antenna (CA) and various means of interacting with one or more antenna modules AMs, according to some embodiments of the invention.

FIG. 5A shows an embodiment of a card antenna CA having an inner winding E and an outer winding D on a card body CB. A first antenna module AM1 is disposed to overlap the inner winding E of the card antenna CA at one side (right, as viewed) thereof, and may be a DIF antenna module such as has been described above.

Generally, at least a portion of the module antenna MA overlaps at least a portion of the card antenna CA for coupling thereto without the intermediary of a coupling coil associated with the card antenna CA. Here, one side of a rectangular-shaped module antenna MA is shown overlapping the inner winding E of the card antenna CA. The module antenna MA may have another shape, such as round or oval, and it may overlap the outer winding D rather than the inner winding E. In some embodiments disclosed herein, the overlap between the module antenna MA and the card antenna CA is increased such as by overlapping two sides of a rectangular module antenna MA with the selected portion of the card antenna CA.

A second antenna module AM2 having its own module antenna MA is disposed to overlap the inner winding E of the card antenna CA at another side (left, as viewed) thereof, and may be a contactless only antenna module for multi-application transponders, providing additional security, and the like. Both of the antenna modules AM1 and AM2 are coupled to the same, inner winding E of the card antenna CA, and can communicate with each other as well as with an external reader (see FIG. 1A).

Figure 5B:
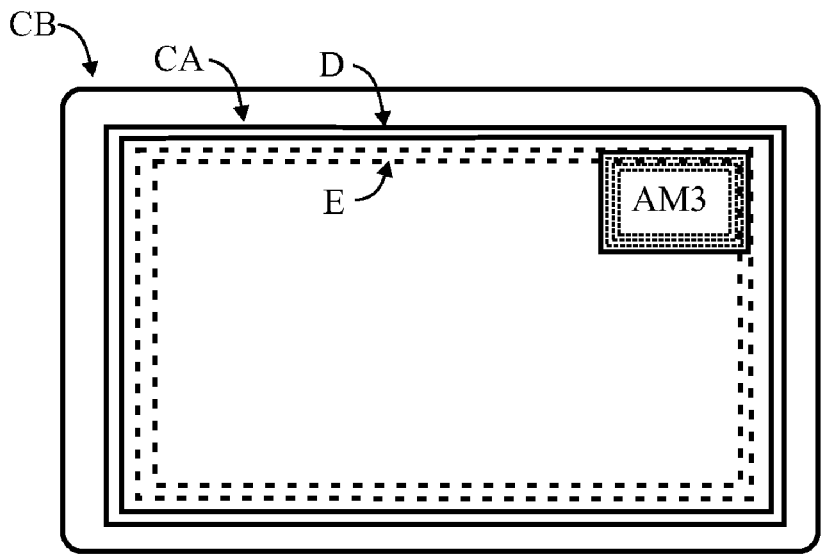

FIG. 5B shows an example of coupling two side edges of an antenna module AM3 to the card antenna CA. Here, the antenna module AM3 is disposed at a corner of the rectangular card antenna CA, such as the top right corner so that the top and right side edges of the antenna module AM3 overlap the a portion of the top and right edges of the inner winding E. This is a suitable location for a contactless-only (ISO 14443) antenna module AM3. Locating a DIF antenna module with contact pads at this location on a smart card may be prohibited by other prescribed form factors (such as embossing areas).

Two-edge coupling of the module antenna MA to the card antenna CA may provide greater coupling than one-edge coupling (other factors being equal).

Figure 5C:
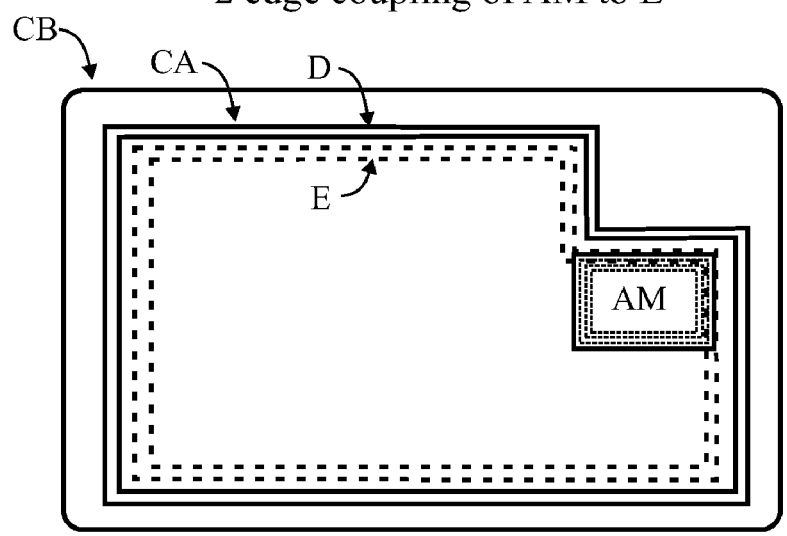

FIG. 5C shows another example of coupling two side edges of the antenna module AM to the card antenna CA. Here, the card antenna CA deviates from rectangular in that in the upper right corner (as viewed) it angles in from the top edge of the card for a distance, then angles out to the right edge of the card body CB, these two right angles resulting in an "L-shaped" path (jog, cutout) at the upper right hand corner of the card antenna CA, approximately the size of an antenna module AM.

In the previous example of FIG. 5B, the antenna module AM3 was in the upper right corner of the smart card, and could not have a contact interface. Here, the antenna module AM can be disposed midway up the card body CB, the same as in any FIGS. 4A, 4C, 4D, 4G, 4H, 5A, and can therefore suitably be a DIF antenna module having contact pads. (A second contactless only antenna module, not shown, could be disposed in the top right corner of the card body CB, where it would be coupled with the outer winding D to provide additional features, as discussed above with respect to FIG. 5A.)

Figure 5D:
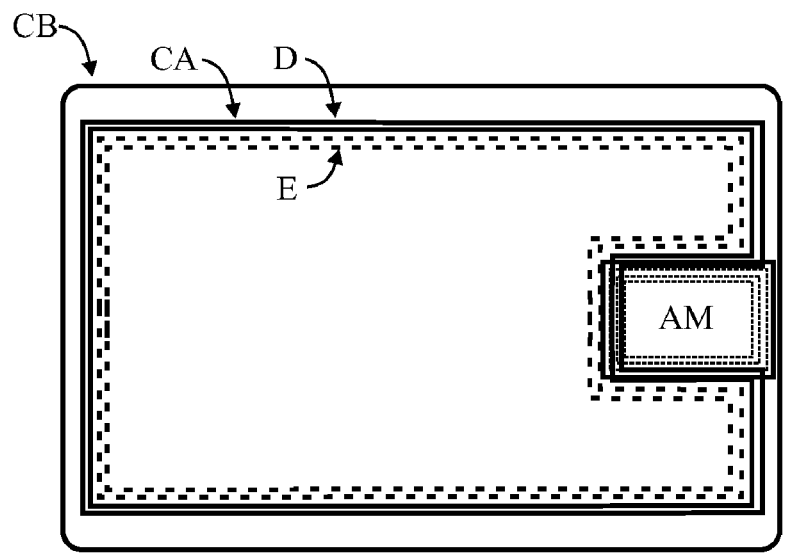

FIG. 5D shows a configuration wherein the card antenna CA deviates from rectangular in that it has a "U-shaped" jog (or cutout) comprising two right angles, extending inward from the right edge of the card antenna CA, midway up the card body CB, suitable shaped and sized to accommodate an antenna module AM disposed midway up the card body CB which and can suitably be a DIF antenna module having contact pads. In FIG. 4A the antenna module AM couples with the inner winding E, in FIG. 5D the antenna module AM couples with the outer winding D.

Whereas the configuration of FIG. 5C enabled coupling 2 sides of the antenna module AM with the card antenna CA, the "U-shaped" cutout allows for coupling 3 sides of the antenna module AM with the card antenna CA, and a consequent increase in coupling efficiency. In this configuration, the antenna module AM overlaps the outer winding D rather than the inner winding E.

A second antenna module could be added in the manner of FIG. 5A (AM2), the second antenna module being coupled with the other, inner winding E. Recall that these couplings are relevant primarily to the contactless mode, and coupling each of two antenna modules to different ones of the two coupling antenna windings (D or E) may provide additional capability.

Figure 5E:
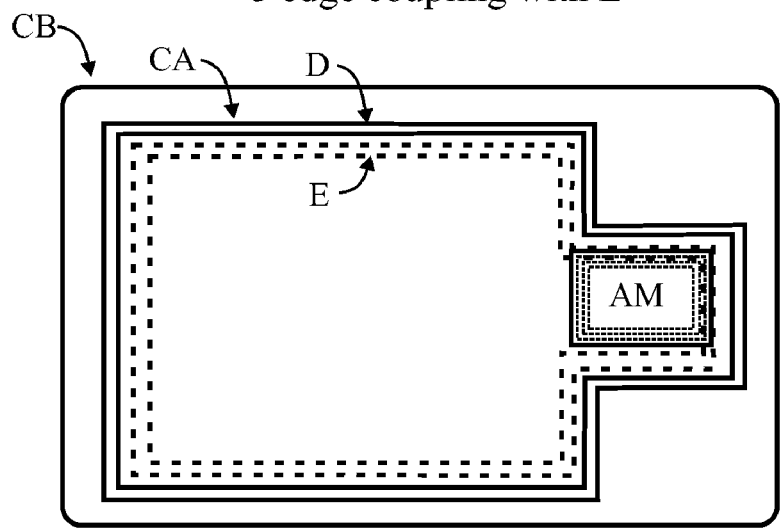

FIG. 5E shows a configuration wherein the card antenna CA deviates from rectangular in that it has a "U-shaped" projection extending outward from the right edge of the card antenna, midway up the card body CB, suitable shaped and sized to accommodate an antenna module AM disposed midway up the card body CB which and can suitably be a DIF antenna module having contact pads. Contrast with FIG. 5D which has an inward jog and the antenna module AM is disposed external to the card antenna CA, coupling with the outer winding D. Here, the card antenna CA projects outward, the antenna module AM is disposed interior to the card antenna CA and couples with the inner winding E.

This configuration provides for 3-side coupling of the antenna module AM with the inner winding E of the card antenna CA. (Recall that the configuration of FIG. 5D also provided for 3-sided coupling, but with the outer winding D.)

An advantage illustrated by this configuration is that a given antenna module (AM1) may be coupled with the inner winding E and another given at least one antenna module can readily be located for coupled with the outer winding D, in either of the "L-shaped" cutouts.

Figure 5F:
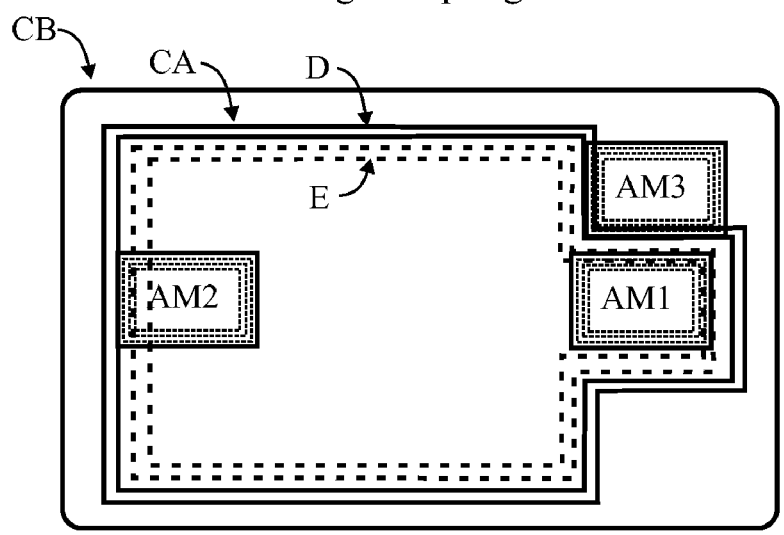

FIG. 5F shows a configuration wherein the card antenna CA deviates from rectangular in that it has a "U-shaped" projection extending outward from the right edge of the card antenna, midway up the card body CB, in a manner identical (for discussion purposes) to the a "U-shaped" projection in FIG. 5E, and similarly, a DIF antenna module AM1 is disposed in the projection.

This figure illustrates that an additional antenna module AM2 can be disposed midway up the card body CB, on the left side of the card antenna CA, and can suitably be a second DIF antenna module having contact pads. Additionally or alternatively, a third antenna module AM3 can be disposed in the upper right corner (as shown) of the card antenna CA, outside of the card antenna CA, so as to couple with the outer winding D of the card antenna CA. Alternatively, the third antenna module AM3 or yet another antenna module could be disposed in the lower right corner of the card antenna CA.

The ease with which additional antenna modules (AM2, AM3) may be incorporated, simply by overlapping the card antenna CA at a different location than the first antenna module (AM1) illustrates another profound difference with Assa Abloy or Toppan, either of which would require an additional coupling coil for each of the additional antenna modules.

Figure 5G:
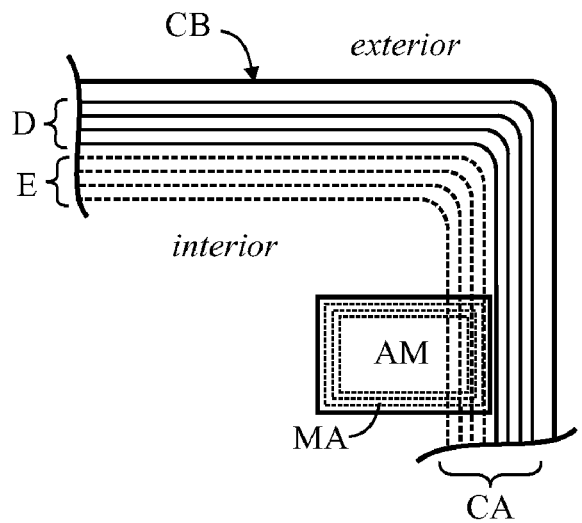

FIG. 5G is a diagram showing an upper right corner of a card body CB with a card antenna CA. The outer winding D (solid lines) has 4 turns of wire, and is close to the exterior edge of the card body CB. The inner winding E (dashed lines) has 4 turns of wire, is located inside of the outer winding D, towards the interior of the card body CB. Some considerations in configuring the card antenna CA include . . .

in this example, the module antenna MA overlaps the inner winding E

Figure 5H:
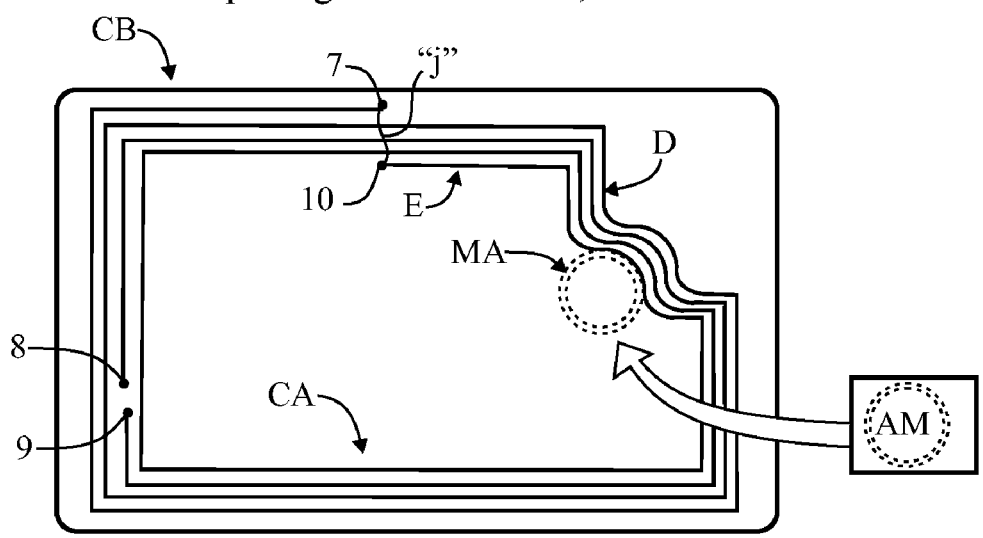

The two windings E, D may have substantially the same number of turns (such as 3 or 4, each), the same length and the same pitch as one another, and be spaced as closely as possible to each other over much of their perimeter. The spacing between the outermost turn(s) of the inner winding E and the innermost turn(s) of the outer winding D should be maintained as close as possible, in order to maximize the reactive coupling.

the card antenna CA may be fine-tuned (resonance frequency adjusted) altering the pitch of the outermost turns of the outer winding D (compare U.S. Pat. No. 7,928,918, Gemalto)

the outermost turn(s) of the inner winding E should be as close as possible to the innermost turn(s) of the outer winding D for effective coupling of the two windings E, D FIG. 5H illustrates a configuration for the card antenna CA similar to FIG. 5C. Only two turns for each of the inner E and outer D windings are shown, for illustrative clarity (typically they would have 3 or 4 turns, each). Instead of an "L" shaped jog formed with right angles (FIG. 5C), the inner E and outer D windings follow a more "gentle" arcuate (curving) path, including a radiussed portion where a circular module antenna MA will overlap the inner winding E, such as with 90-degrees of its circumference (compare coupling with one or more edges of a rectangular module antenna MA, as discussed above). Generally, the objective is to cover as much overlapped surface area as possible between the card antenna CA and the module antenna MA. This configuration illustrates an antenna module AM with a round module antenna MA, and the card antenna CA is patterned to provide an opportunity for substantial overlap at an appropriate location on the card body CB. Some other considerations in configuring the card antenna CA include . . .

the connected ends or positions 7, 10 should be as close together as possible the turns of the winding can be spread slightly to accommodate the free ends 8, 9 ends which are located in the middle of the card antenna CA.

create a channel in the substrate for the connection "j" by laser ablation or milling note that the ends 8, 9 are in the middle separating the inner winding E from the outer winding D. This "wire break" should be maintained as small as possible so that the innermost turns of the outer winding D and the outermost turns of the inner winding E are maintained in close proximity with one another.

An Application for a Contactless RFID Tag

To direct the flux field emanating from a high frequency RFID tag, a ferrite layer with high magnetic permeability can be integrated into an intermediate layer of a card body, with said layer hosting an area of resin with magnetic fillers, ferrite nanoparticles in a polymer or a sheet of sintered ferrite, for the purpose of reducing eddy current losses and to decouple the RFID tag from an underlying metal surface such as the metal casing of a battery in a mobile telephone. This shielding in the HF band prevents attenuation of the carrier wave (13.56 MHz) caused by inducing eddy currents on the metal surface of the battery. Without shielding, the eddy currents create a magnetic field reversing the direction of the carrier wave.

Figure 6A:
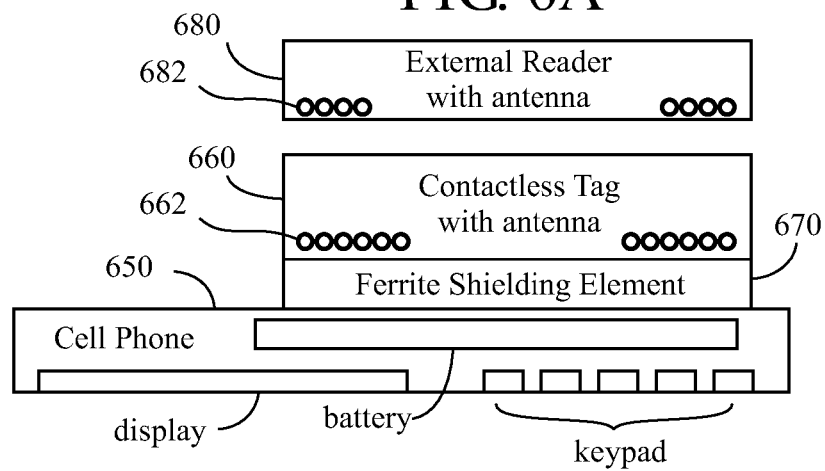
FIG. 6A is a cross-sectional view of a technique for applying a mobile phone sticker (MPS) to a cell phone.

FIG. 6A illustrates a cell phone 650 having a display and a keypad on its front surface (facing down in the figure), and containing a battery pack ("battery"). A contactless RFID device ("tag") 660 is disposed on the back (top, as viewed) surface of the phone. The tag 660 has an antenna 662 inside for interacting with an external RFID reader 680. The antenna 662 may be a conventional antenna integral with the tag. The reader 680 also has an antenna 682 associated therewith, typically much larger than illustrated.

The tag 660 is exemplary of a mobile phone sticker (MPS) which may be used for e-payment, e-ticketing, loyalty and access control applications.

A ferrite (or other suitable material) shielding element 670 is disposed between the back of the cell phone 650 and the tag 660 to alleviate attenuation of coupling between the tag and the reader. The element may be in the form of a film or tape, and may have adhesive on both sides for sticking the contactless tag to the phone. Double-sided tapes having adhesive on both sides are well known, such as for mounting carpets.

Figure 6B:
FIG. 6B is a cross-sectional view of a shielding element used in the technique for applying a mobile phone sticker (MPS) to a cell phone, according to some embodiments of the invention.

FIG. 6B shows the ferrite shielding element 670 may comprise:

a core layer (or substrate) 672 which may be in the form of an elongate tape measuring a few centimeters wide and having two surfaces and having ferrite (or other) particles (including nanostructures) dispersed throughout an adhesive layer 674 on a bottom (as viewed) surface of the tape an adhesive layer 676 on a top (as viewed) surface of the tape, and a release layer 678 which will be peeled off and discarded, protecting the top adhesive layer 676.

The shielding element is suitably delivered in roll form, similar to common double-back adhesive tape, and the release layer prevents the bottom adhesive layer 674 from sticking to the top adhesive layer 676 when the shielding tape 670 is rolled up (in roll supply form).

Some Manufacturing Processes

Figure 7A:
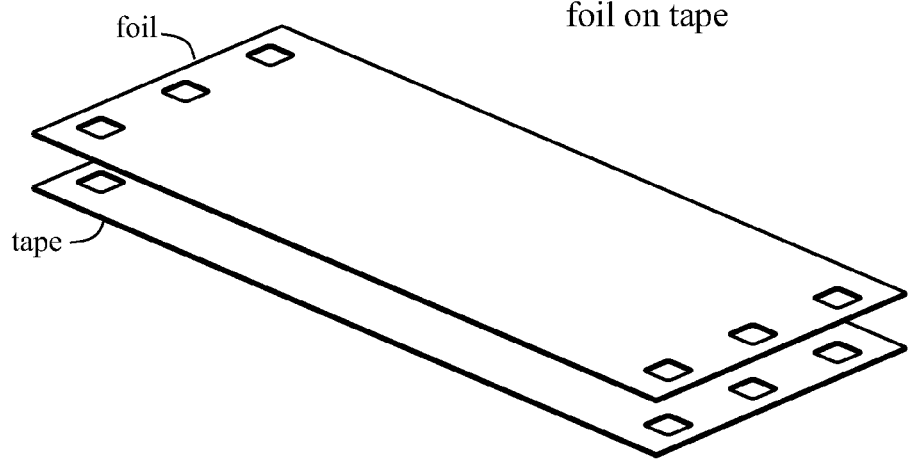
FIGS. 7A, 7B, 7C, 7D are perspective views of steps involved in a method for making antenna modules (AMs), according to some embodiments of the invention.

FIG. 7A illustrates a first step in an exemplary manufacture and assembly of an antenna module (AM) comprising:

copper foil with gold, nickel or palladium plating, module tape (MT) such as conventional "super 35 mm" tape super 35 mm tape. Holes may be provided through the tape, for connecting from the opposite side of the tape to the underside of the foil, such as with plated through holes (PTH)

Figure 7B:
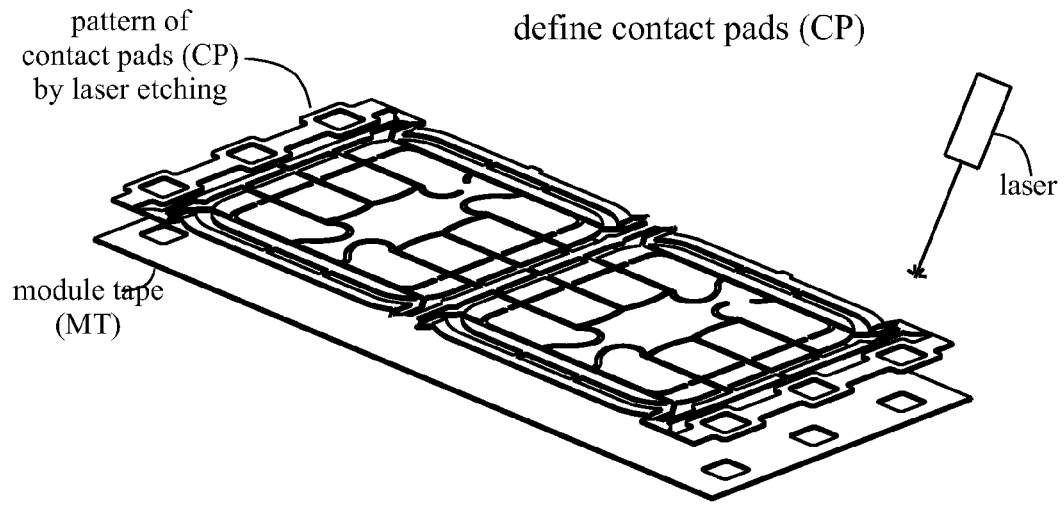

FIG. 7B illustrates a further step in the manufacture and assembly of the antenna module (AM). The foil is laser etched to have a number (such as six) of contact pads (CP) for contact interface. This is the familiar terminal block of contacts seen on many bank cards and the like. On the opposite side of the tape, not visible, a chip module CM and module antenna MA will be provided.

Figure 7C:
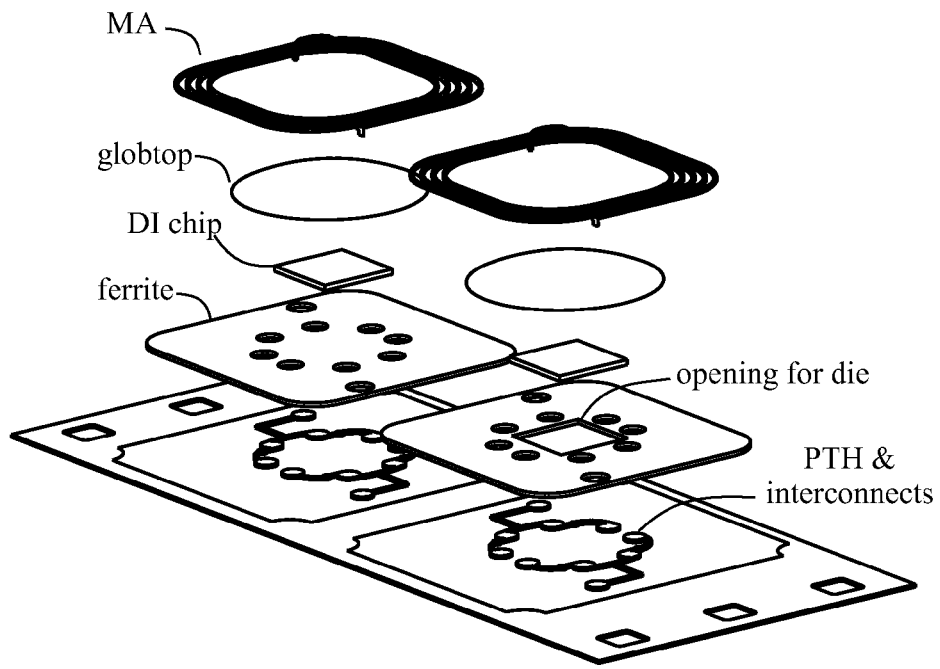
Figure 7D:
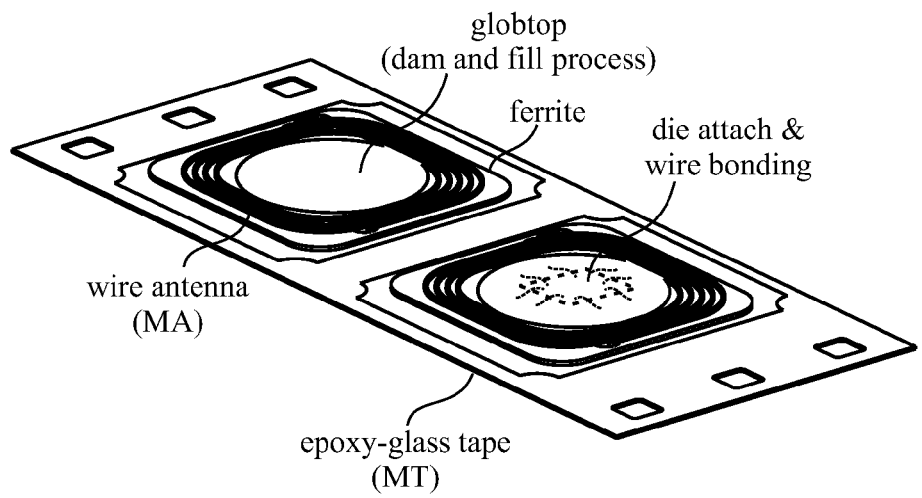

FIGS. 7C, 7D illustrate the opposite side of the module tape MT. (In this view, the contact pads CP are not visible.) Plated Through Holes (PTH) and some interconnects are visible. A DI chip may be mounted to the module tape MT and wire bonded to the plated through holes PTH and interconnects. A module antenna MA may be mounted and connected. Globtop (a conformal coating of resin) may be applied to protect the die and wire bonds, the module antenna MA acting as a dam for the glob-top. Alternatively, the module antenna MA can be mounted onto the mold mass (glob-top) of the antenna module AM as a flat antenna structure.

A ferrite layer may be provided, as discussed hereinabove (FIG. 1D, 156) with holes for interconnects (such as wire bonds). FIG. 7C illustrates (right side) that an opening (FIG. 1D, 158) may be provided through the ferrite layer to accommodate the die.

Figure 7E:
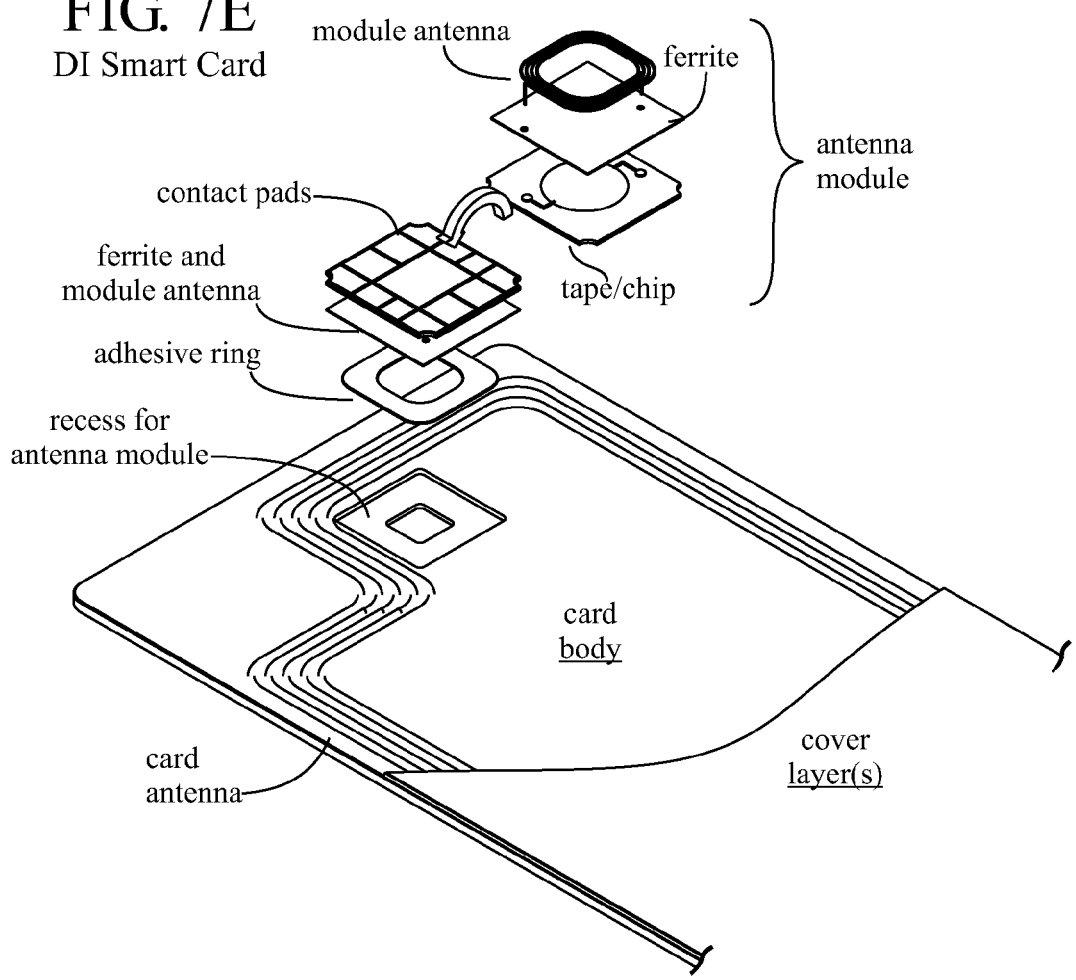
FIG. 7E is a perspective view of a smart card implementing some of the embodiments of the invention disclosed herein.

FIG. 7E shows a DI smart card formed using the antenna module of FIG. 7D, on a card body (CB) having a card antenna (CA).

Channels can be formed in a substrate such as the card body CB for accepting a wire (or conductive material) laid therein.

(for example, U.S. Pat. No. 7,028,910—Schlumberger). A recess can be formed for accepting the antenna module AM. (See FIGS. 1A, 7E). Channels and recesses can be formed in a substrate using laser ablation.

Figure 7F:
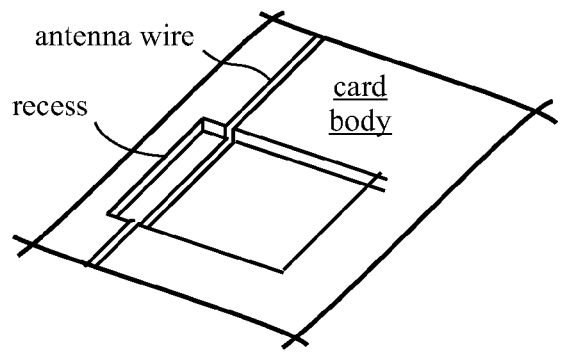
FIG. 7F is a perspective view of a portion of a card body CB with an antenna wire passing through a recess for an antenna module AM.

FIG. 7F illustrates the antenna wire extending into, across the bottom of, and emerging out of the recess for accepting the antenna module AM (FIG. 7E). Only a relevant portion of the card body CB and only one turn of the antenna wire are shown, for illustrative clarity. This facilitates minimizing the distance between the module antenna MA and the card antenna CA when the module antenna MA is implanted in the card body CB, the close proximity ensuring effective coupling of the module antenna MA with the card antenna CA.

While the invention(s) has/have been described with respect to a limited number of embodiments, these should not be construed as limitations on the scope of the invention(s), but rather as examples of some of the embodiments. Those skilled in the art may envision other possible variations, modifications, and implementations that are also within the scope of the invention(s), based on the disclosure(s) set forth herein.

What is claimed is:

1. A smart card comprising:
an antenna module (AM) comprising at least one chip or chip module (CM) and a module antenna (MA);
a card body (CB) having at least one surface and a periphery; and
a card antenna (CA) extending around the periphery of the card body (CB);
characterized in that at least a portion of the module antenna (MA) overlaps at least a portion of the card antenna (CA) for coupling thereto without the intermediary of a coupling coil associated with the card antenna (CA);
wherein:
the card antenna (CA) comprises two windings (D,E) connected in reverse phase with one another; and
the antenna module (AM) overlaps only one of the two windings (D,E) for coupling thereto.

2. The smart card of claim 1, wherein:
the card antenna (CA) is formed with jogs or cutouts for maximizing overlap of the module antenna (MA) with the card antenna (CA).

3. The smart card of claim 1, further comprising:
additional one or more antenna modules (AM2, AM3) overlapping the card antenna (CA).

4. The smart card of claim 1, further comprising:
ferrite material disposed on or in the card body for enhancing coupling of the module antenna (MA) to the card antenna (CA).

5. The smart card of claim 1, wherein the antenna module (AM) further comprises:
contact pads (CP) for a contact mode of operation.

6. The smart card of claim 5, further comprising:
a ferrite element (PE) for decoupling the module antenna (MA) from the contact pads (CP).

7. The smart card of claim 6, wherein:
the card antenna (CA) is patterned to increase overlap between the module antenna (MA) and the selected portion of the card antenna (CA).

8. A smart card comprising:
an antenna module (AM) comprising at least one chip or chip module (CM) and a module antenna (MA);
a card body (CB) having at least one surface and a periphery; and
a card antenna (CA) extending around the periphery of the card body (CB);
characterized in that at least a portion of the module antenna (MA) overlaps at least a portion of the card antenna (CA) for coupling thereto without the intermediary of a coupling coil associated with the card antenna (CA);
wherein the card antenna (CA) comprises:
an outer winding (D) having an outer end (7) and an inner end (8);
an inner winding (E) having an outer end (9) and an inner end (10);
the inner end (10) of the inner winding (E) is connected with the outer end (7) of the outer winding (D); and
the inner end (8) of the outer winding (D) and the outer end (9) of the inner winding (E) are unconnected.

9. The smart card of claim 8, wherein:
the card antenna (CA) is formed with jogs or cutouts for maximizing overlap of the module antenna (MA) with the card antenna (CA).

10. The smart card of claim 8, further comprising:
additional one or more antenna modules (AM2, AM3) overlapping the card antenna (CA).

11. The smart card of claim 8, further comprising:
ferrite material disposed on or in the card body for enhancing coupling of the module antenna (MA) to the card antenna (CA).

12. The smart card of claim 8, wherein the antenna module (AM) further comprises:
contact pads (CP) for a contact mode of operation.

13. The smart card of claim 12, further comprising:
a ferrite element (FE) for decoupling the module antenna (MA) from the contact pads (CP).

14. The smart card of claim 13, wherein:
the card antenna (CA) is patterned to increase overlap between the module antenna (MA) and the selected portion of the card antenna (CA).

15. A smart card comprising:
an antenna module (AM) comprising at least one chip or chip module (CM) and a module antenna (MA);
a card body (CB) having at least one surface and a periphery; and
a card antenna (CA) extending around the periphery of the card body (CB);
characterized in that at least a portion of the module antenna (MA) overlaps at least a portion of the card antenna (CA) for coupling thereto without the intermediary of a coupling coil associated with the card antenna (CA);
wherein the module antenna (MA) comprises:
a first antenna structure (A) in the form of a coil having first and second ends (1,2);
a second antenna structure (B) in the form of a coil having first and second ends (3,4);
a third antenna structure (C) in the form of a coil having first and second ends (5,6);
the first end (4) of the second antenna structure (B) is connected with the first end (1) of the first antenna structure (1) and to a first terminal of the chip module (CM), the second end (3) of the second antenna structure (B) is left unconnected; and
the first end (5) of the third antenna structure (C) is connected with the second end (2) of the first antenna structure (1) and to a second terminal of the chip module (CM), the second end (6) of the third antenna structure (C) is left unconnected.

16. The smart card of claim 15, wherein:
the card antenna (CA) is formed with jogs or cutouts for maximizing overlap of the module antenna (MA) with the card antenna (CA).

17. The smart card of claim 15, further comprising:
additional one or more antenna modules (AM2, AM3) overlapping the card antenna (CA).

18. The smart card of claim 15, further comprising:
ferrite material disposed on or in the card body for enhancing coupling of the module antenna (MA) to the card antenna (CA).

19. The smart card of claim 15, wherein the antenna module (AM) further comprises:
contact pads (CP) for a contact mode of operation.

20. The smart card of claim 19, further comprising:
a ferrite element (FE) for decoupling the module antenna (MA) from the contact pads (CP).

21. The smart card of claim 20, wherein:
the card antenna (CA) is patterned to increase overlap between the module antenna (MA) and the selected portion of the card antenna (CA).

22. A method of coupling a chip module (CM) having at least a contactless mode to a card antenna (CA) disposed on a card body (CB) of a smart card, comprising providing a module antenna (MA) in an antenna module (AM) with the chip module (CM), characterized by:
providing the card antenna (CA) as "quasi dipole" antenna having two winding portions connected in reverse phase with one another.

23. The method of claim 22, wherein:
the card antenna (CA) has an inner winding (E) and an outer winding (D); and
the module antenna (MA) overlaps only one of the inner and outer windings (E, D).

24. The method of claim 22, wherein the chip module (CM) is a dual interface (DI) chip module having contact pads (CP), further comprising:
ferrite (FE) disposed between the module antenna (MA) and the contact pads (CP).

25. The method of claim 22, wherein the module antenna (MA, 200) comprises:
a first antenna structure (A) in the form of a coil having two ends (1,2);
a second antenna structure (B) in the form of a coil having a first end (4) connected with one end (1) of the first antenna structure (A), and a second end (3) left unconnected; and
a third antenna structure (C) in the form of a coil having a first end (5) connected with another end (2) of the first antenna structure (A), and a second end (6) left unconnected:
the second and third antenna structures forming capacitive stubs for the first antenna structure (A).

26. The method of claim 22, further comprising:
patterning the card antenna (CA) to maximize overlap with the module antenna (MA).

\* \* \* \* \*